(12) United States Patent
Shimizu

(10) Patent No.: US 6,476,438 B2
(45) Date of Patent: Nov. 5, 2002

(54) NONVOLATILE SEMICONDUCTOR MEMORY DEVICE AND METHOD OF MANUFACTURING THE SAME

(75) Inventor: Shu Shimizu, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/903,762

(22) Filed: Jul. 13, 2001

(65) Prior Publication Data

US 2002/0109180 A1 Aug. 15, 2002

(30) Foreign Application Priority Data

Feb. 13, 2001 (JP) .......................................... 2001-035590

(51) Int. Cl.$^7$ .............................................. H01L 29/72
(52) U.S. Cl. ...................... 257/314; 257/315; 257/316; 257/321; 257/322; 438/621; 438/630
(58) Field of Search ................................ 257/314, 315, 257/316, 321, 322; 438/621, 630

(56) References Cited

FOREIGN PATENT DOCUMENTS

| JP | 10-335497 | | 12/1998 | |
| JP | 11-3981 | | 1/1999 | |
| JP | 11-261038 | | 9/1999 | |
| JP | 11261038 | * | 9/1999 | .................. 257/314 |

* cited by examiner

Primary Examiner—Edward Wojchechowicz
(74) Attorney, Agent, or Firm—McDermott, Will & Emery

(57) ABSTRACT

A nonvolatile semiconductor memory device includes a semiconductor substrate having a main surface, a floating gate electrode having a doped polycrystalline silicon film formed on the main surface with a thermal oxide film therebetween, and a doped polycrystalline silicon film laid over the doped polycrystalline silicon film and having an upward wall, an insulating film covering the doped polycrystalline silicon film, and a control gate electrode formed on the insulating film.

13 Claims, 38 Drawing Sheets

NONVOLATILE SEMICONDUCTOR MEMORY DEVICE AND METHOD OF MANUFACTURING THE SAME

BACKGROUND OF THE INVENTION

1. Field of the Invention

The present invention relates to a nonvolatile semiconductor memory device and a method of manufacturing the same, and particularly relates to a structure of a nonvolatile semiconductor memory device, which can improve a coupling ratio between a floating gate electrode and a control gate electrode, as well as a method of manufacturing the same.

2. Description of the Background Art

A self-align STI (Shallow Trench Isolation) has been known as a technique for improving a density in a nonvolatile semiconductor memory device. The self-align STI is a technique for forming a trench in a self-aligned fashion using patterned doped polycrystalline silicon, which will form floating gate electrodes in a memory cell part.

FIG. 33 is a cross section of a conventional nonvolatile semiconductor memory device employing the self-align STI.

As shown in FIG. 33, the nonvolatile semiconductor memory device includes a peripheral circuit part and a memory cell part. A silicon oxide film 2 for element isolation is formed at a main surface of a semiconductor substrate 1 in the peripheral circuit part, and a trench 3 and a silicon oxide film 21 for element isolation are formed for at the main surface of semiconductor substrate 1 in the memory cell part.

Memory cell transistors are formed in the memory cell part. Each memory cell transistor has a floating gate electrode 8 formed on the main surface of semiconductor substrate 1 with a thermal oxide film 4 therebetween, an insulating film 9 and a control gate electrode 35.

Floating gate electrode 8 is formed of a doped polycrystalline silicon film 6, and control gate electrode 35 has a doped polycrystalline silicon film 10 and a WSi film 11. A silicon oxide film 12 is formed on control gate electrode 35.

MOS (Metal Oxide Semiconductor) transistors are formed in the peripheral circuit part. The MOS transistor has a gate electrode 13 formed on semiconductor substrate 1 with a thermal oxide film 5 therebetween. Gate electrode 13 has doped polycrystalline silicon film 10 and WSi film 11. Silicon oxide film 12 is formed on gate electrode 13.

The memory cell transistors and the MOS transistors described above are covered with an interlayer insulating film 14. Interlayer insulating film 14 has contact holes 15, in which tungsten plugs 16 are formed, respectively. An interconnection film 17 electrically connected to tungsten plug 16 is formed on interlayer insulating film 14.

A method of manufacturing the nonvolatile semiconductor memory device having the above structure will now be described with reference to FIGS. 34–38.

As shown in FIG. 34, silicon oxide film 2 is formed at the peripheral circuit part, and thermal oxide film 4 is formed on the main surface of semiconductor substrate 1. Doped polycrystalline silicon film 6 is formed on thermal oxide film 4, and is patterned.

Semiconductor substrate 1 masked with doped polycrystalline silicon film 6 is etched to form trench 3 at the memory cell part in a self-aligned fashion. Trench 3 is filled with silicon oxide film 21.

Then, insulating film 9 is deposited on doped polycrystalline silicon film 6, and photoresist 36 of a predetermined configuration is formed on insulating film 9. Etching is effected using photoresist 36 as a mask so that insulating film 9, doped polycrystalline silicon film 6 and thermal oxide film 4 on the peripheral circuit part are removed.

Then, as shown in FIG. 36, thermal oxide film 5 is formed on the peripheral circuit part, and doped polycrystalline silicon film 10, WSi film 11 and silicon oxide film 12 are deposited on thermal oxide film 5. Photoresist 37 of a predetermined configuration is formed on silicon oxide film 12, and silicon oxide film 12 masked with photoresist 37 is etched.

After removing photoresist 37, WSi film 11 and doped polycrystalline silicon film 10 masked with silicon oxide film 12 are etched. Thereby, control gate electrode 35 in the memory cell part and gate electrode 13 of the MOS transistor in the peripheral circuit part are formed as shown in FIG. 37.

Photoresist 38 covering the peripheral circuit part is formed, and etching is effected on insulating film 9 and doped polycrystalline silicon film 6 in the memory cell part using photoresist 38 as a mask. Thereby, floating gate electrode 8 is formed in the memory cell part.

Thereafter, interlayer insulating film 14 is deposited, and each contact hole 15 is formed in interlayer insulating film 14. Tungsten plug 16 is formed in contact hole 15, and interconnection film 17 is formed on interlayer insulating film 14. Through the steps described above, the nonvolatile semiconductor memory device shown in FIG. 33 is completed.

In the nonvolatile semiconductor memory device shown in FIG. 33, trench 3 for element isolation is formed by etching semiconductor substrate 1, which is masked with doped polycrystalline silicon film 6 forming floating gate electrode 8. Therefore, independent photolithography for forming trench 3 is not required, and therefore, it is not necessary to ensure, in the photolithography step, an overlapping margin and a margin required in view of variations in size. Therefore, the density in the nonvolatile semiconductor memory device can be improved.

However, due to the fact that the overlapping margin and the margin for variations in size are not required for the photolithography as described above, the surface area of floating gate electrode 8 decreases in the main surface direction of semiconductor substrate 1 as shown in FIG. 33.

This reduces the capacitance between control gate electrode 35 and floating gate electrode 8, and lowers the coupling ratio.

SUMMARY OF THE INVENTION

The invention has been made for overcoming the foregoing disadvantage, and it is an object of the invention to provide a nonvolatile semiconductor memory device, in which a coupling ratio between a control gate electrode and a floating gate electrode is improved.

A nonvolatile semiconductor memory device according to the invention includes a semiconductor substrate having a main surface; a floating gate electrode having a first conductive film formed on the main surface with a tunnel insulating film therebetween, and a second conductive film laid over the first conductive film and having a convexity; an insulating film covering the second conductive film; and a control gate electrode formed on the insulating film.

As described above, the second conductive film of the floating gate electrode is provided with the convexity, and the insulating film and the control gate electrode cover the convexity. Thereby, a capacitor can be formed between the convexity and the control gate electrode. This can increase the capacitance between the floating gate electrode and the control gate electrode.

Since the floating gate electrode has the multilayer structure formed of the conductive films, the following advantages can be achieved. The characteristics of the tunnel insulating film are significantly affected by a state of an interface between the semiconductor substrate and the tunnel insulating film as well as a state of an interface between the tunnel insulating film and the floating gate electrode. However, when forming the first conductive film, which will form the lower conductive film of the floating gate electrode, and thus when forming the interface between the tunnel insulating film and the floating gate electrode, an impurity concentration of the first conductive film, which is required for achieving a good state of the interface, may not match with an impurity concentration, which is electrically optimum for the floating gate electrode. Accordingly, the floating gate electrode is formed of, e.g., a multilayer structure having the first and second conductive films. Owing to this structure, the impurity concentration of the first conductive film can be kept at a value required for forming a good interface with respect to the tunnel insulating film, and further the impurity concentration of the second conductive film can be appropriately adjusted so that the impurity concentration of the floating gate electrode can likewise be set to an optimum value from the electrical viewpoint.

The convexity preferably includes an upward wall extending upward from a peripheral portion of the second conductive film. In this case, the insulating film and the control gate electrode cover the side surface of the upward wall.

Thereby, a capacitor can be formed between the upward wall of the floating gate electrode and the control gate electrode so that a capacitance between the floating gate electrode and the control gate electrode can be increased.

The nonvolatile semiconductor memory device has a trench for element isolation, and the trench is formed by etching the semiconductor substrate masked with the first conductive film.

As described above, the trench for element isolation is formed in a self-aligned fashion with respect to the first conductive film so that the density of the nonvolatile semiconductor memory device can be increased. However, this formation of the trench reduces a surface area of the first conductive film, which will form a portion of the floating gate electrode. In connection with this, the second conductive film, which is formed on the first conductive film and has the foregoing convexity, can increase the surface area of the floating gate electrode, and therefore can increase the capacitance between the floating gate electrode and the control gate electrode. Accordingly, the capacitance between the floating gate electrode and the control gate electrode can be increased while keeping a high density of the nonvolatile semiconductor memory device.

A method of manufacturing a nonvolatile semiconductor memory device according to the invention includes the following steps. A mask film including a first conductive film is formed on a main surface of a semiconductor substrate. Etching is effected on the semiconductor substrate masked with this mask film to form a trench for element isolation. A first insulating film covering the trench and the mask film is formed. The thickness of the first insulating film is reduced to expose the mask film. The thickness of the mask film is reduced to expose the first conductive film and to form a convexity projecting upward beyond an upper surface of the first conductive film at the first insulating film. A second conductive film covering the convexity is formed on the first conductive film. The second conductive film located on the convexity is removed to form an upward wall at the second conductive film. A second insulating film and a third conductive film both covering the upward wall are successively formed. The third conductive film, the second insulating film, the second conductive film and the first conductive film are patterned to form the floating gate electrode and the control gate electrode.

By etching the semiconductor substrate masked with the foregoing mask film, the trench can be formed in a self-aligned fashion with respect to the mask film (first conductive film). The thickness of the first conductive film covering the trench and the mask film is reduced to expose the mask film, whereby the first insulating film having an upper surface at the substantially same level as the upper surface of the mask film can be formed in the trench. Thereafter, the thickness of the mask film is reduced to expose the first conductive film so that the first insulating film having the convexity projecting upward beyond the upper surface of the first conductive film can be formed. The second conductive film covering the convexity is formed on the first conductive film, and the second conductive film located on the convexity is removed so that the upward wall extending upward along the side surface of the convexity can be formed at the second conductive film. The second insulating film and the third conductive film covering the upward wall are successively formed, and the third conductive film, the second insulating film, the second conductive film and the first conductive film are patterned to form the control gate electrode on the floating gate electrode with the second insulating film therebetween. In the above step, the upward wall can be formed at the second conductive film of the floating gate electrode so that a capacitor can be formed between the upward wall and the control gate electrode, and the capacitance between the floating gate electrode and the control gate electrode can be increased.

The mask film may be formed of a third insulating film layered on the first conductive film. In this case, the step of forming the mask film includes a step of forming the first conductive film on the main surface of the semiconductor substrate, and a step of forming the third insulating film on the first conductive film. The step of reducing the thickness of the mask film includes a step of exposing the first conductive film by removing the third insulating film.

Since the mask film has the third insulating film on the first conductive film as described above, the convexity can be formed at the first insulating film only by removing the third insulating film after reducing the thickness of the first insulating film. By adjusting the thickness of the third insulating film, the height of the convexity can be adjusted so that the height of the upward wall can be adjusted. By appropriately adjusting the thickness of the third insulating film, an intended capacitance can be provided between the floating gate electrode and the control gate electrode.

The step of forming the upward wall includes the steps of forming a coating film covering the second conductive film, reducing the thickness of the coating film to expose the surface of the second conductive film located on the convexity while leaving the coating film on the second conductive film located around the convexity, and removing the exposed second conductive film to form the upward wall.

Since the second conductive film extends above the convexity, irregularities are present at the surface of the second conductive film. In view of this, the coating film covering the second conductive film is formed, and the thickness of the coating film from its surface is reduced so that the surface of the second conductive film located on the convexity can be exposed while leaving the coating film on the second conductive film located around the convexity. By removing the exposed second conductive film, the second conductive film can be left along the side surface of the convexity, and the upward wall can be formed at the second conductive film.

The coating film includes photoresist. In this case, the step of forming the coating film includes a step of applying photoresist covering the second conductive film, and the step of reducing the thickness of the coating film includes a step of performing development after effecting exposure on the whole surface of the photoresist, and thereby exposing the surface of the second conductive film on the convexity while leaving the photoresist around the convexity. In this case, the upward wall can be formed at the second conductive film, similarly to the foregoing case.

The nonvolatile semiconductor memory device includes a peripheral circuit part and a memory cell part, and has a fourth insulating film for element isolation at the peripheral circuit part. The first insulating film is located within the memory cell part. In this case, the fourth insulating film may be formed before formation of the first insulating film, or may be formed in the same step as the first insulating film. The fourth insulating film may be formed by selectively oxidizing the semiconductor substrate, or may be formed within the trench for element isolation formed in the peripheral circuit part.

The fourth insulating film may be formed independently of the first insulating film, whereby the element isolating structures suitable to the peripheral circuit part and the memory cell part can be selected. By forming the fourth insulating film and the first insulating film in the same step, the process can be simple.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to FIGS. 1–32.

First Embodiment

Figure 1:
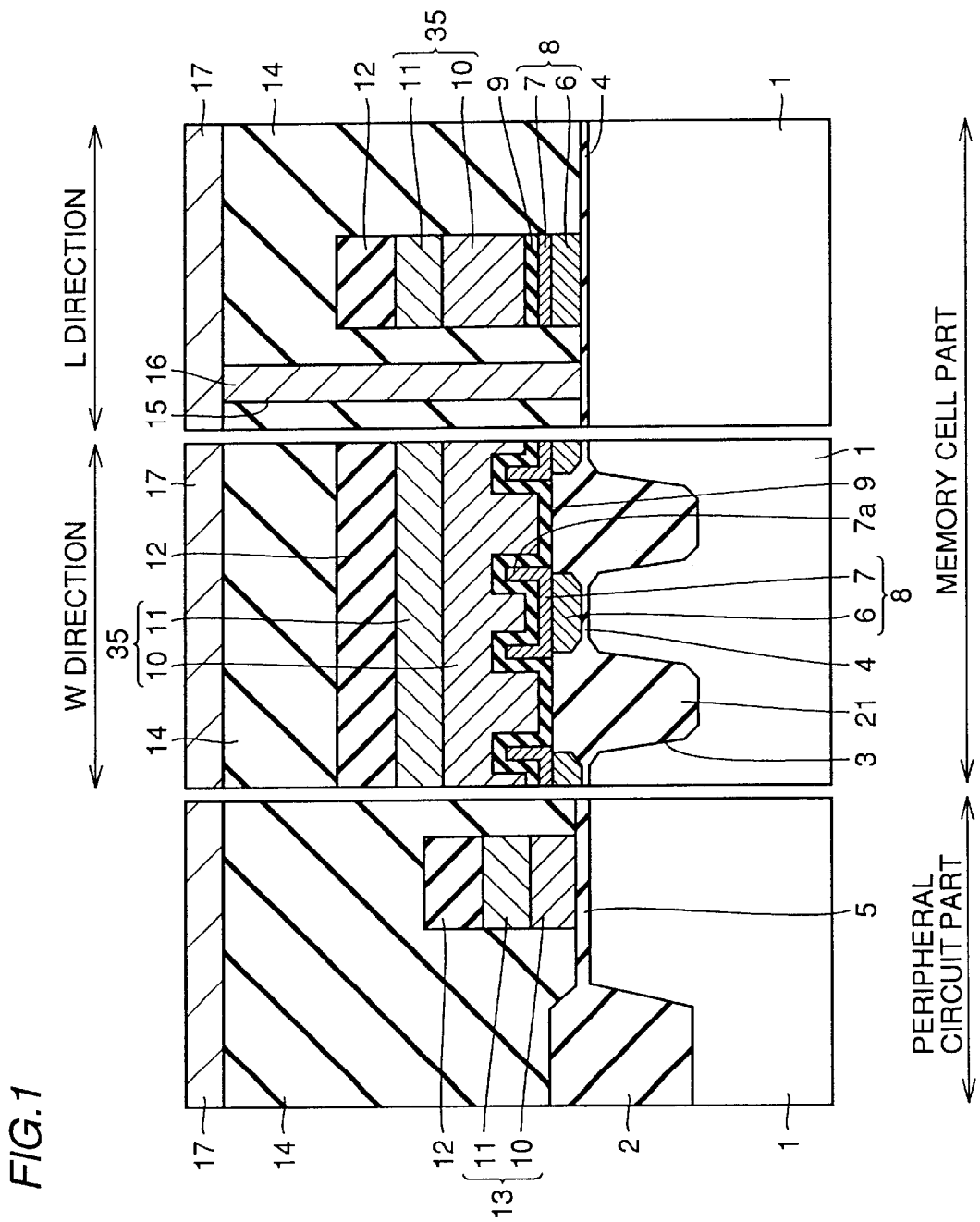
FIG. 1 is a cross section of a nonvolatile semiconductor memory device of a first embodiment of the invention.

FIG. 1 is a cross section showing a peripheral circuit part and a memory cell part of a nonvolatile semiconductor memory device of a first embodiment of the invention. In FIG. 1, "W direction" indicates a widthwise direction of the memory cell part, and "L direction" indicates a lengthwise direction of the memory cell part, which is perpendicular to the W direction.

As shown in FIG. 1, a semiconductor substrate 1 in the peripheral circuit part is provided at its main surface with a silicon oxide film 2 for element isolation. In the memory cell part, semiconductor substrate 1 is provided at its main surface with a trench 3 and a silicon oxide film 21 for element isolation. Trench oxide film 2 may be formed within a trench (not shown) formed in the peripheral circuit part.

Trench 3 has a depth of about 400 nm, and is formed in a self-aligned manner by effecting etching on semiconductor substrate 1 masked with a doped polycrystalline silicon film (first conductive film) 6, which will be described later. Thereby, a high density can be achieved in the nonvolatile semiconductor memory device.

Memory cell transistors are formed in the memory cell part. The memory cell transistor has a floating gate electrode 8, which is formed on the main surface of semiconductor substrate 1 with a thermal oxide film (tunnel insulating film) 4 therebetween, as well as an insulating film 9 and a control gate electrode 35.

Thermal oxide film 4 has a thickness of about 10 nm. Floating gate electrode 8 has a multilayer structure including conductive films. In the embodiment shown in FIG. 1, floating gate electrode 8 is formed of doped polycrystalline silicon film 6 of about 100 nm in thickness and a doped polycrystalline silicon film (second conductive film) 7 of about 50 nm in thickness formed on doped polycrystalline silicon film 6.

In the example shown in FIG. 1, doped polycrystalline silicon film 7 has a substantially U-shaped (crown-like) section, and has an upward or standing wall 7a extending upward from its peripheral portion. The upper and side surfaces of upward wall 7a are covered with insulating film 9 and control gate electrode 35.

Thereby, a capacitor can be formed between upward wall 7a and control gate electrode 35 so that a capacitance between floating gate electrode 8 and control gate electrode 35 can be increased.

As described above, the nonvolatile semiconductor memory device has trench 3, which is formed in a self-aligned manner using doped polycrystalline silicon film 6 as a mask. Therefore, the capacitance between floating gate electrode 8 and control gate electrode 35 can be increased while keeping a high density in the nonvolatile semiconductor memory device.

Accordingly, the coupling ratio between floating gate electrode 8 and control gate electrode 35 can be improved while keeping a high density in the nonvolatile semiconductor memory device.

A convexity of any form other than upward wall 7a may be arranged on doped polycrystalline silicon film 7 located at the upper level provided that the convexity can increase a surface area of floating gate electrode 8. Thereby, a similar effect can be achieved.

Floating gate electrode 8, which has the multilayer structure including the conductive films, can achieve the following advantage. The characteristics of the thermal oxide film (tunnel insulating film) 4 are significantly affected by the state of the interface between semiconductor substrate 1 and thermal oxide film 4 as well as the state of the interface between thermal oxide film 4 and floating gate electrode 8.

However, when forming doped polycrystalline silicon film 6, which will form the lower conductive film of floating gate electrode 8, (i.e., when forming the interface between thermal oxide film 4 and floating gate electrode 8), such a situation may occur that the impurity concentration of doped polycrystalline silicon film 6, which is required for providing the above interface in a good state, does not match with an impurity concentration which is electrically optimum for floating gate electrode 8.

In view of this, floating gate electrode 8 is formed of the multilayer structure including doped polycrystalline silicon films 6 and 7, whereby the impurity concentration in doped polycrystalline silicon film 6 can be set to a value, which is required for forming the good interface between thermal oxide film 4 and doped polycrystalline silicon film 6, and at the same time, the impurity concentration of doped polycrystalline silicon film 7 can be appropriately adjusted so that the impurity concentration of floating gate electrode 8 can likewise be set to the electrically optimum value.

For example, deposition is performed under such conditions that the impurity concentration of doped polycrystalline silicon film 6 is set to a low value optimum for the characteristics of thermal oxide film 4, and the impurity concentration of doped polycrystalline silicon film 7 is set to a high value. Thereby, it is possible to diffuse the impurity from doped polycrystalline silicon film 7, which has a high impurity concentration, and is located at a high level, into doped polycrystalline silicon film 6 at a lower level, and finally, the impurity concentration of floating gate electrode 8 can be adjusted to an intended value.

The thickness of doped polycrystalline silicon film 7 is preferably smaller than the thickness of doped polycrystalline silicon film 6, and is set to, e.g., about half the thickness of doped polycrystalline silicon film 6.

By employing doped polycrystalline silicon film 7 thinner than doped polycrystalline silicon film 6, the total thickness of these films can be small. Therefore, the multilayer film formed of doped polycrystalline silicon films 6 and 7 can be easily patterned on thin thermal oxide film 4.

Insulating film 9 is formed of, e.g., a three-layer insulating film (ONO film) including an oxide film of about 5 nm in thickness, a nitride film of about 10 nm in thickness and an oxide film of about 5 nm in thickness, which are layered together.

Control gate electrode 35 has a doped polycrystalline silicon film 10 of about 100 nm in thickness and an WSi film 11 of about 100 nm in thickness. A silicon oxide film 12 of about 200 nm in thickness is formed on control gate electrode 35.

MOS transistors are formed in the peripheral circuit part. Each MOS transistor has a gate electrode 13 formed on semiconductor substrate 1 with thermal oxide film (gate insulating film) 5 therebetween. Gate electrode 13 has doped polycrystalline silicon film 10 and WSi film 11. Silicon oxide film 12 is also formed on gate electrode 13.

The foregoing memory cell transistors and the MOS transistors are covered with an interlayer insulating film 14, which has a thickness of about 1000 nm and is made of, e.g., a silicon oxide film. Interlayer insulating film 14 has a contact hole 15, in which a tungsten plug 16 is formed. An interconnection film 17, which is made of Al—Cu or the like, and is electrically connected to tungsten plug 16, is formed on interlayer insulating film 14.

A method of manufacturing the nonvolatile semiconductor memory device having the above structure will now be described with reference t FIGS. 2–15.

Figure 2:
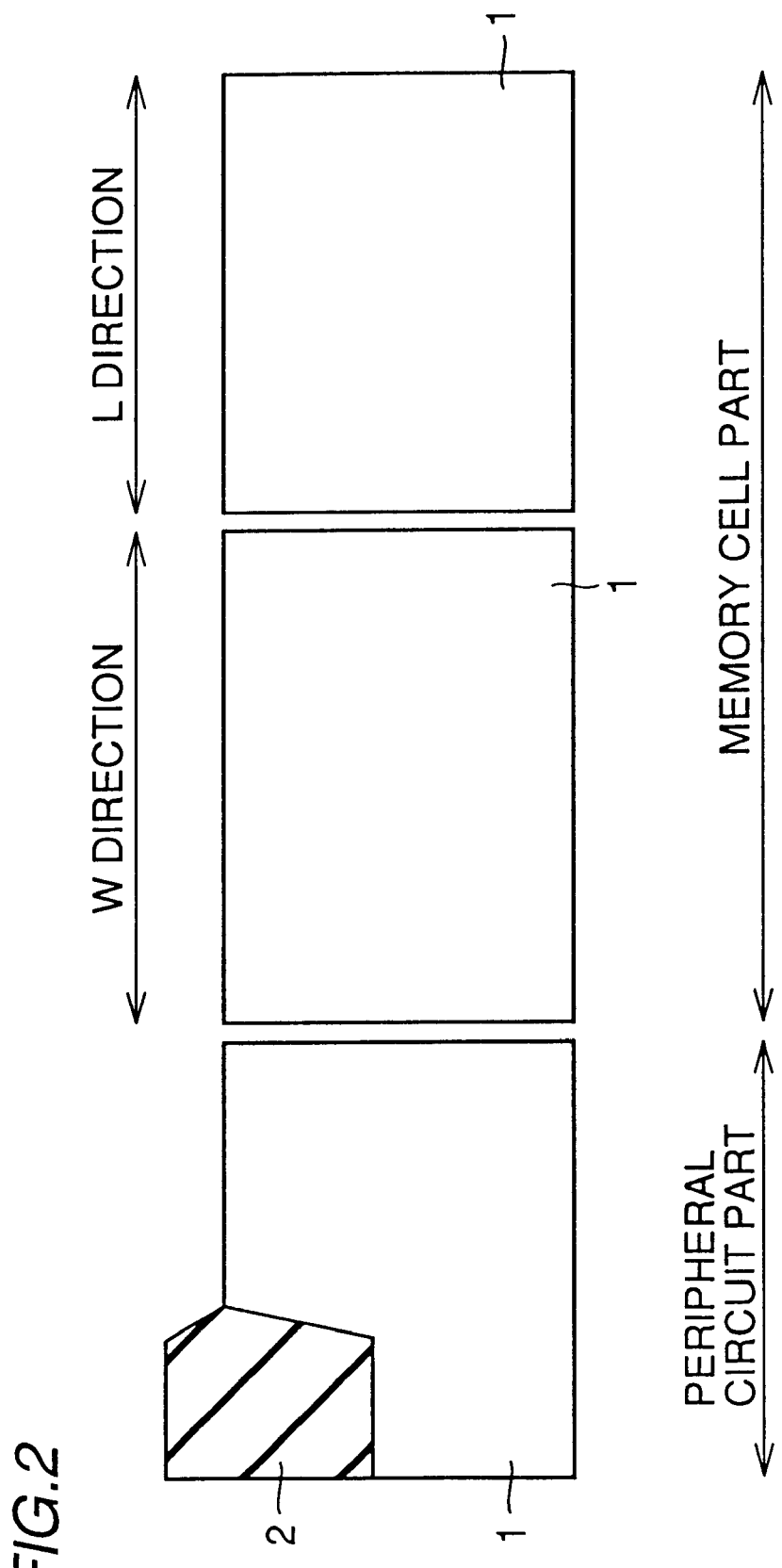
FIGS. 2–15 are cross sections showing 1st to 14th steps in a process of manufacturing the nonvolatile semiconductor memory device shown in FIG. 1, respectively.

As shown in FIG. 2, LOCOS (Local Oxidation of Silicon) is selectively effected on the main surface of semiconductor substrate 1 in the peripheral circuit part so that silicon oxide film (fourth insulating film) 2 for element isolation is formed. For forming the trench isolation region, the trench is formed in the peripheral circuit part in a known manner, and then is filled with the insulating film such as a silicon oxide film. In this state, the element isolating region is not yet formed in the memory region.

After performing the photolithography, ions of phosphorus or arsenic are implanted into semiconductor substrate 1 masked with photoresist (not shown) to form n-wells (not shown). Thereafter, the photolithography is performed again, and boron ions are implanted into semiconductor substrate 1 masked with photoresist (not shown) to form p-wells (not shown).

Then, processing is performed to form thermal oxide film 4, which will form the tunnel insulating film in the memory cell part. By a CVD (Chemical Vapor Deposition) method or the like, doped polycrystalline silicon film 6 is deposited on thermal oxide film 4, and then a silicon nitride film (third insulating film) 18 of about 200 nm in thickness is deposited.

Figure 3:
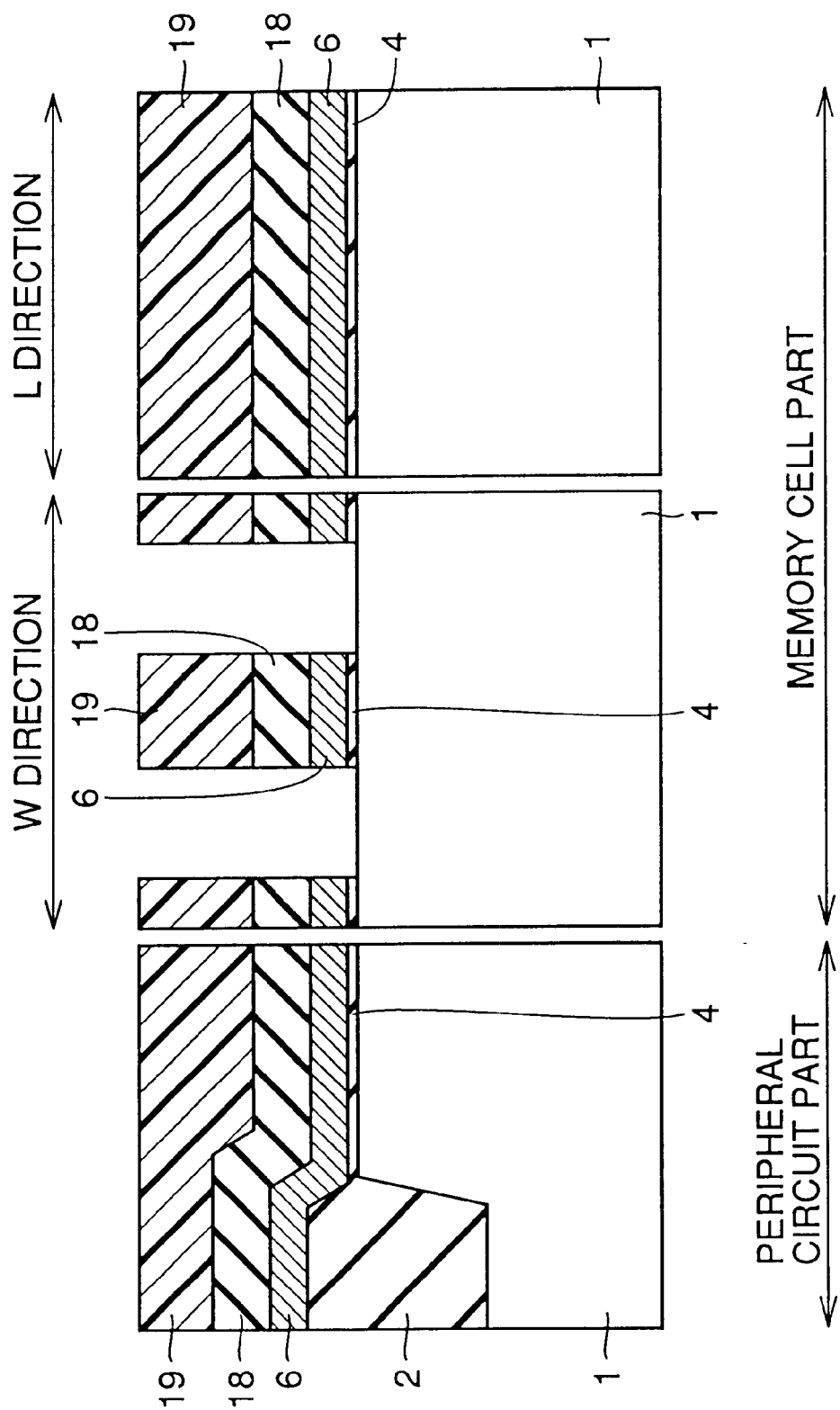

By the photolithography, photoresist 19 is applied to silicon nitride film 18, and then is patterned into a predetermined configuration. Using photoresist 19 as a mask, dry etching is effected on silicon nitride film 18, doped polycrystalline silicon film 6 and thermal oxide film 4 as shown in FIG. 3.

Figure 4:
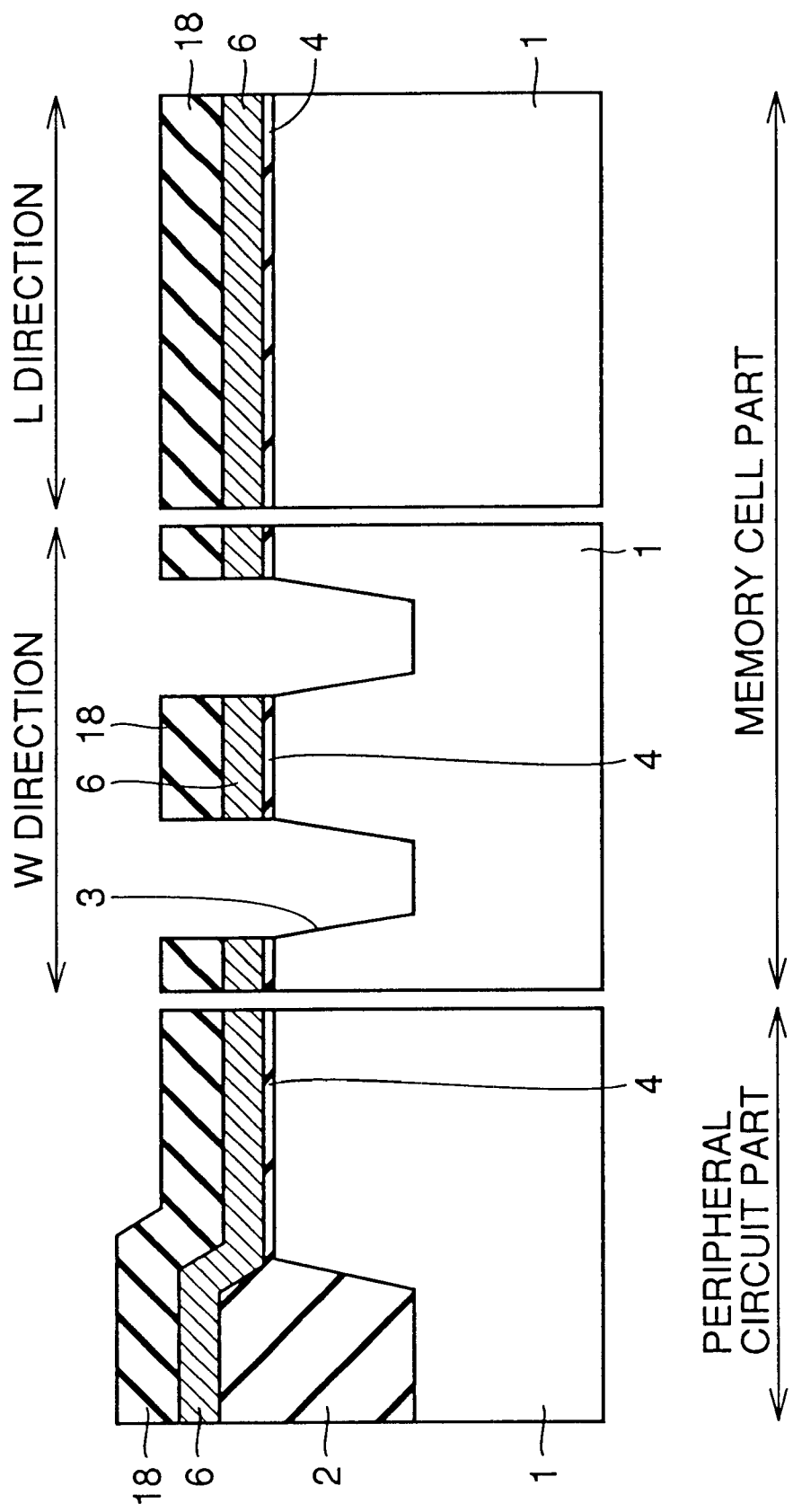

After removing photoresist 19, dry etching is effected on semiconductor substrate 1 masked with a mask film formed of silicon nitride film 18, doped polycrystalline silicon film 6 and thermal oxide film 4. Thereby, trench 3 for element isolation is formed in the memory cell part as shown in FIG. 4. By forming trench 3 with the foregoing mask film, trench 3 can be formed in a self-aligned manner with respect to doped polycrystalline silicon film 6.

Figure 5:
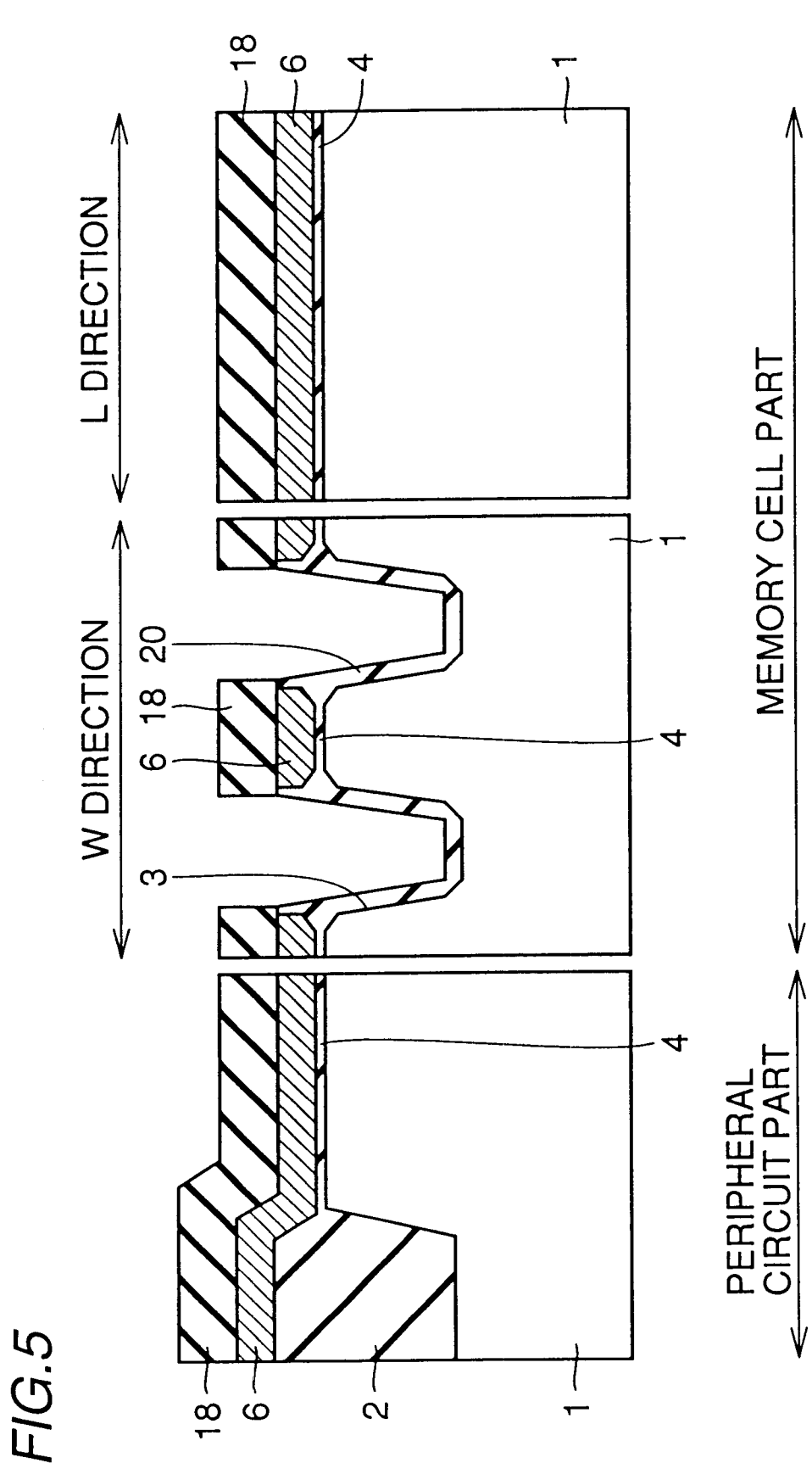
Figure 6:
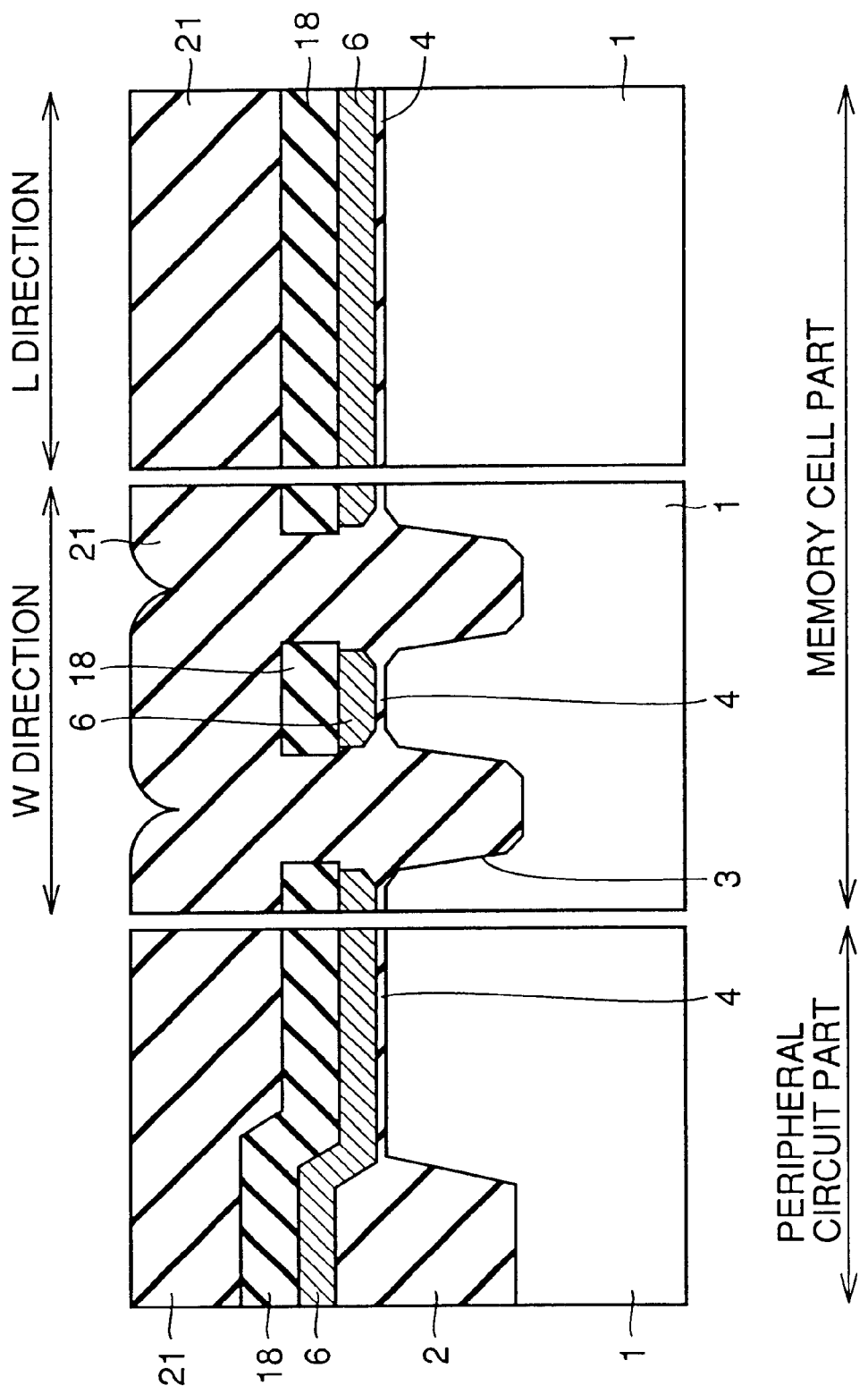

Then, the inside surface of trench 3 is thermally oxidized by about 50 nm. Thereby, a thermal oxide film 20 is formed as shown in FIG. 5. Thereafter, a silicon oxide film (first insulating film) 21 of about 500 nm in thickness is deposited in the CVD method or the like as shown in FIG. 6 so that trench 3 is filled with silicon oxide film 21, and silicon oxide film 21 is also formed on silicon nitride film 18.

Then, the thickness of silicon oxide film 21 is reduced. More specifically, CMP (Chemical Mechanical Polishing) is effected on silicon oxide film 21 to reduce the thickness thereof. Thereby, the surface of silicon nitride film 18 is exposed as shown in FIG. 7.

Figure 7:
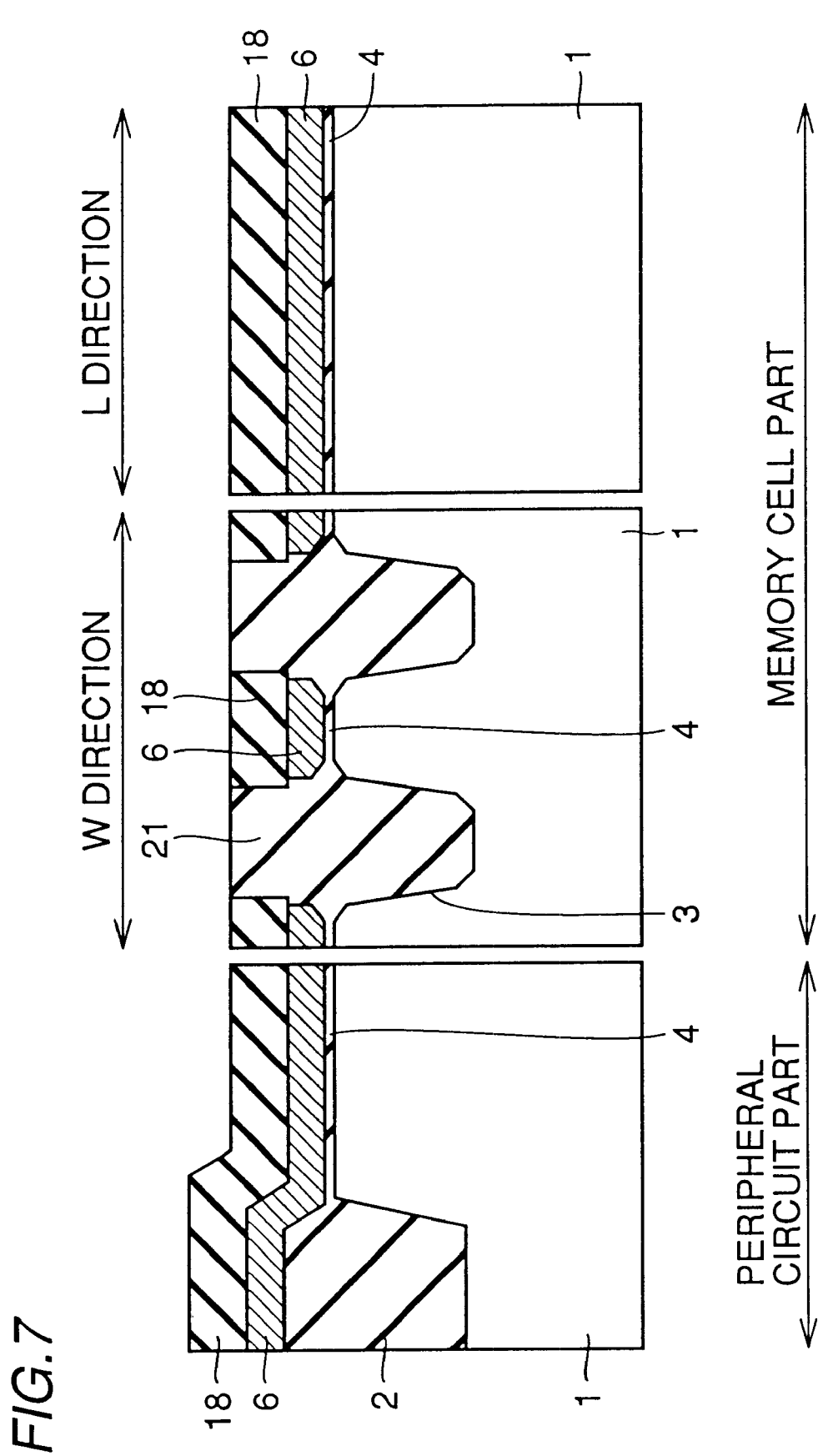

In this state shown in FIG. 7, the upper surface of silicon oxide film 21 is substantially at the same level with the upper surface of silicon nitride film 18, and therefore is located at a higher level than the upper surface of doped polycrystalline silicon film 6.

The upper surface of silicon oxide film 21 may not be flush with the upper surface of silicon nitride film 18 provided that the upper surface of silicon oxide film 21 is located at a higher level than the upper surface of doped polycrystalline silicon film 6.

Processing (e.g., etch-back) other than the CMP can be employed if it can reduce the thickness of silicon oxide film 21 from its surface.

Figure 8:
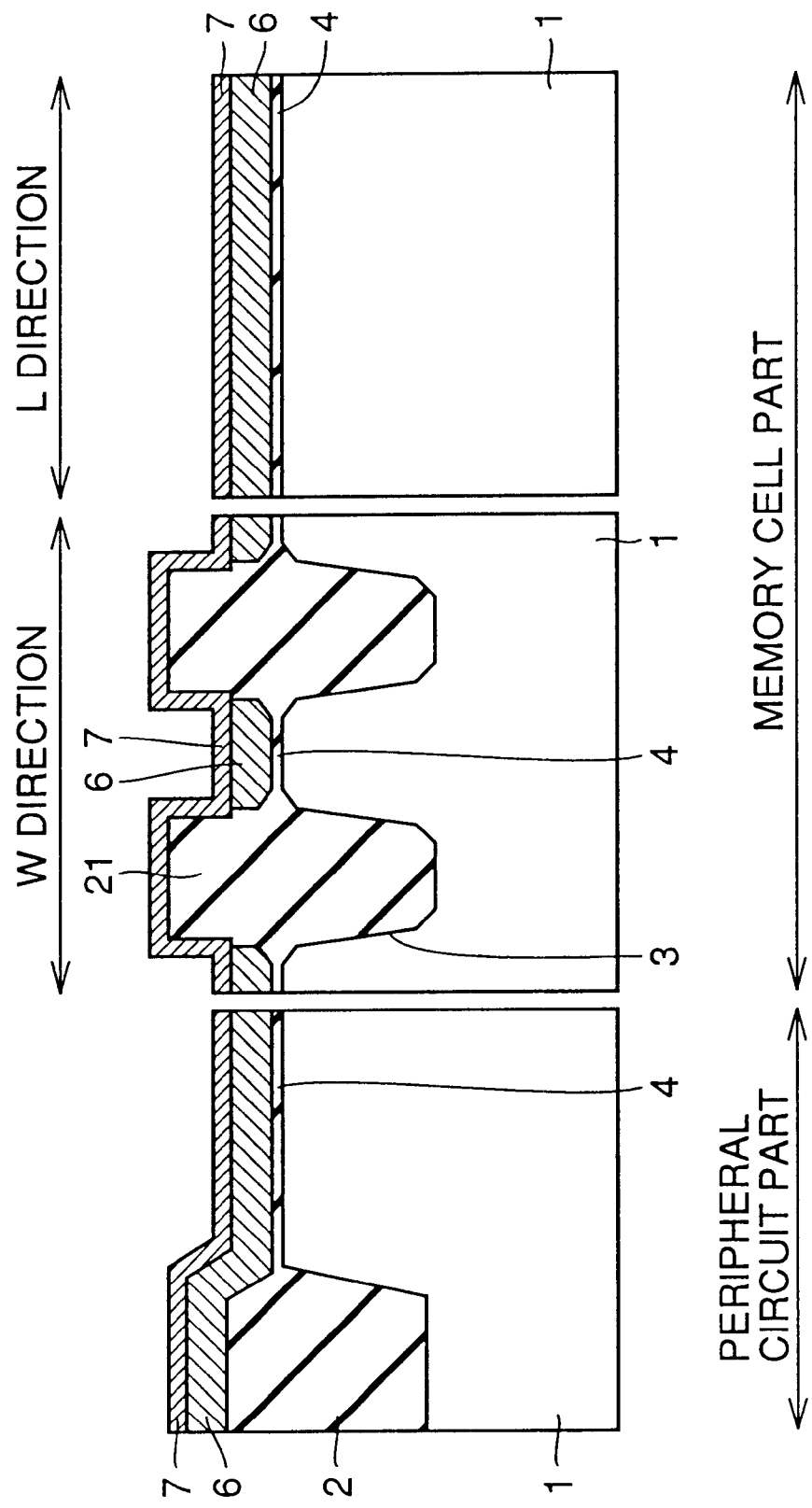
Figure 9:
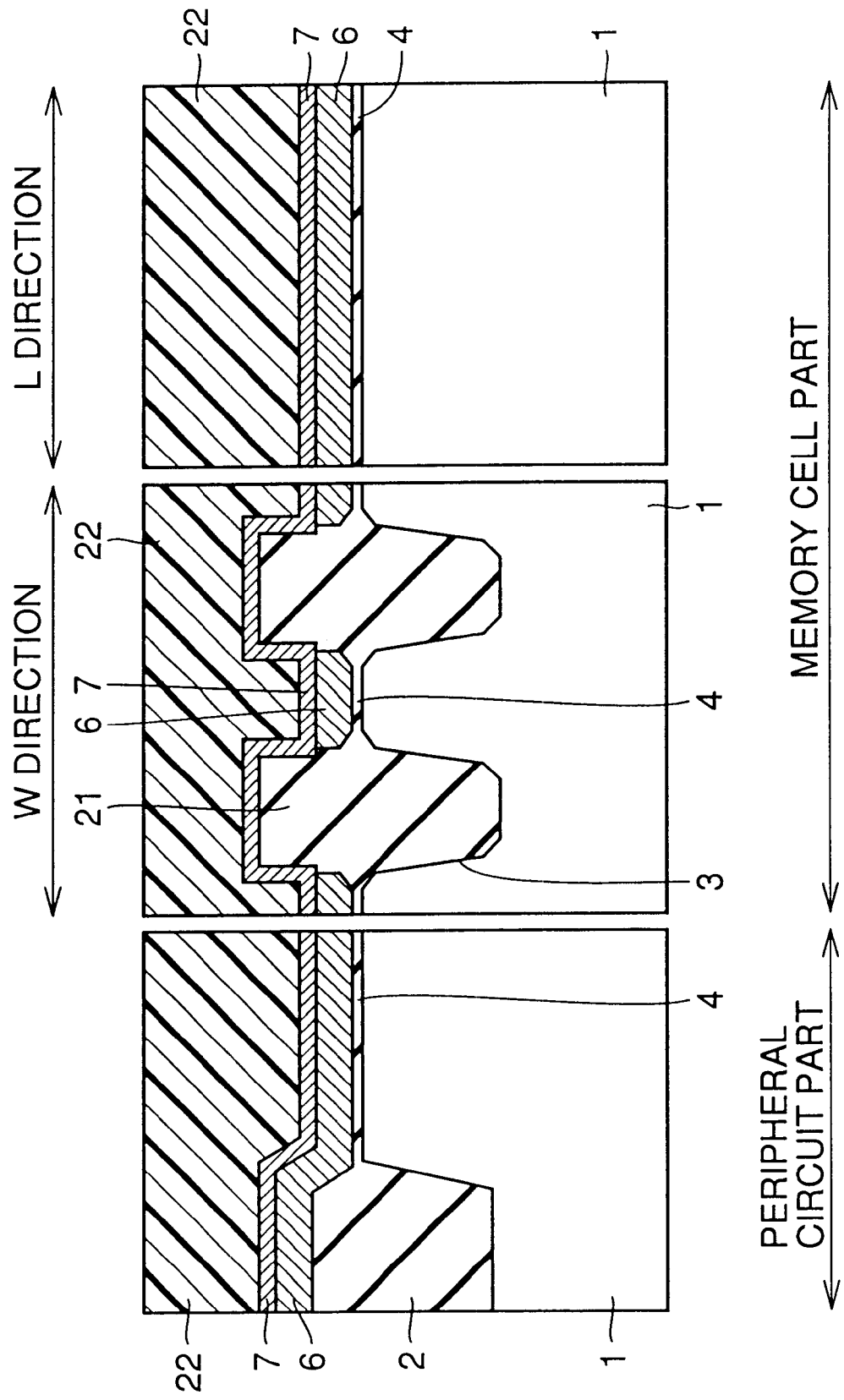

Then, silicon nitride film 18 is removed by thermal phosphoric acid. Thus, the thickness of the foregoing mask film is reduced. Thereby, doped polycrystalline silicon film 6 is exposed, and a convexity projecting upward beyond the upper surface of doped polycrystalline silicon film 6 is consequently formed at silicon oxide film 21 as shown in FIG. 8. In this state, the trench element isolation (STI) according to the invention is formed.

The height of the convexity of silicon oxide film 21 can be adjusted by controlling the thickness of silicon nitride film 18, and thereby upward wall 7a of doped polycrystalline silicon film 7, which will be described later, can be adjusted. Accordingly, by appropriately adjusting the thickness of silicon nitride film 18, a capacitor of an intended capacitance can be added between floating gate electrode 8 and control gate electrode 35.

By the CVD method of the like, doped polycrystalline silicon film 7 covering the convexity of silicon oxide film 21 is deposited on doped polycrystalline silicon film 6. Photoresist 22 is applied onto doped polycrystalline silicon film 7.

In this state, the height to the upper surface of doped polycrystalline silicon film 6 from the main surface of semiconductor substrate 1 is smaller than the height to the upper surface of silicon oxide film 21 (trench element isolation (STI)) from the main surface of semiconductor substrate 1. Therefore, the thickness of photoresist 22 located on doped polycrystalline silicon film 6 is larger than the thickness of photoresist 22 located on silicon oxide film 21.

Figure 10:
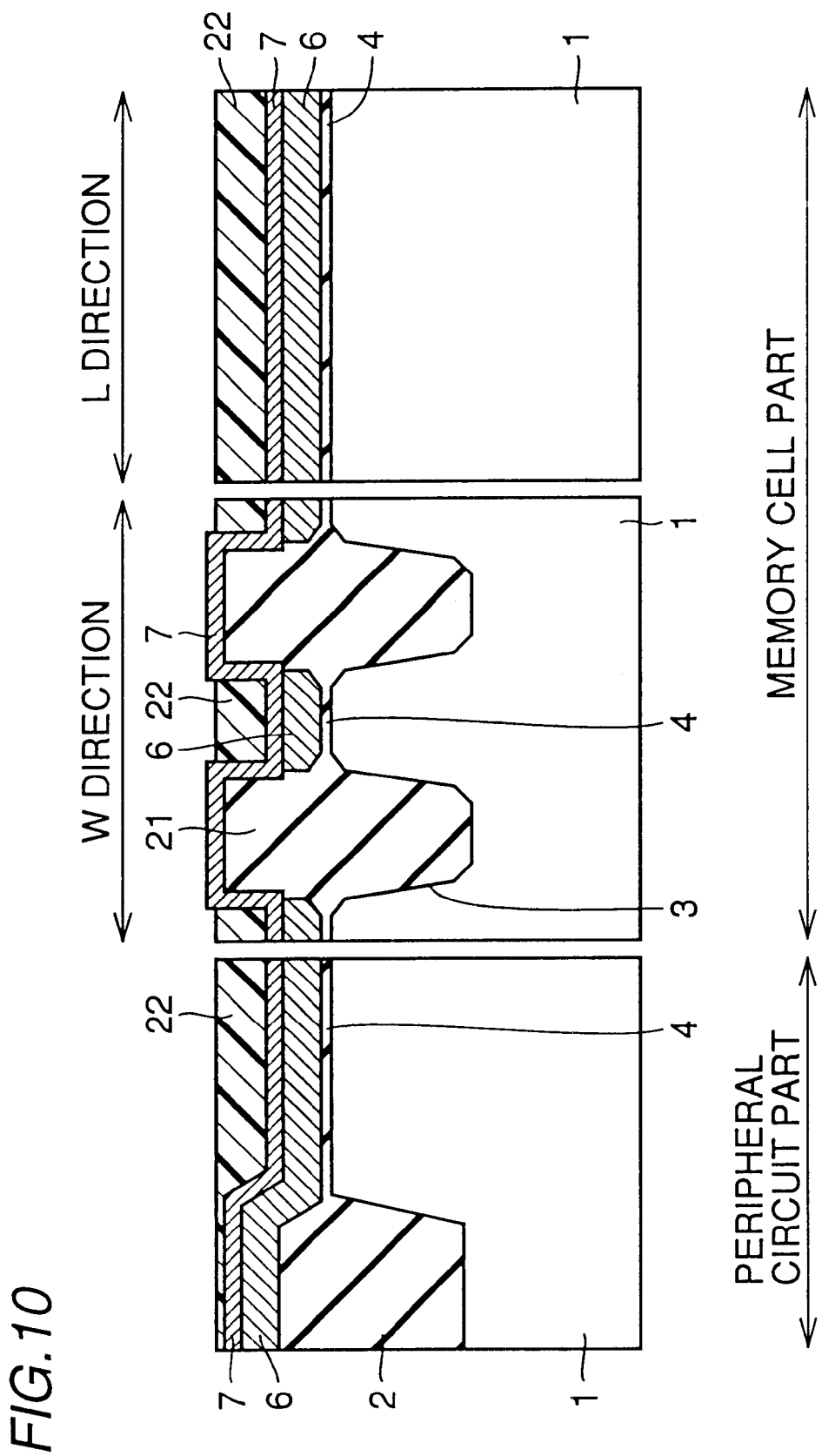

In the state, exposure is effected on the whole surface, and development is performed. By appropriately adjusting the exposure time, only a portion of photoresist 22 can be removed by an intended thickness from its surface so that only the surface of doped polycrystalline silicon film 7 located on the trench element isolation (STI) can be exposed as shown in FIG. 10. Thus, photoresist 22 can be left on only doped polycrystalline silicon film 6, on which thick photoresist 22 was located.

A coating film other than photoresist 22 may be employed. In this case, the coating film covering doped polycrystalline silicon film 7 is formed, and then is subjected to surface polishing or the like for reducing its thickness. Thereby, only the surface of doped polycrystalline silicon film 7 located above the trench element isolation (STI) can be exposed while leaving the coating film on doped polycrystalline silicon film 6 located around the trench element isolation (STI).

In the state shown in FIG. 10, etch-back is effected on doped polycrystalline silicon film 7. Thereby, only doped polycrystalline silicon film 7, which is located on the trench element isolation (STI), and is not covered with photoresist 22, can be removed.

Figure 11:
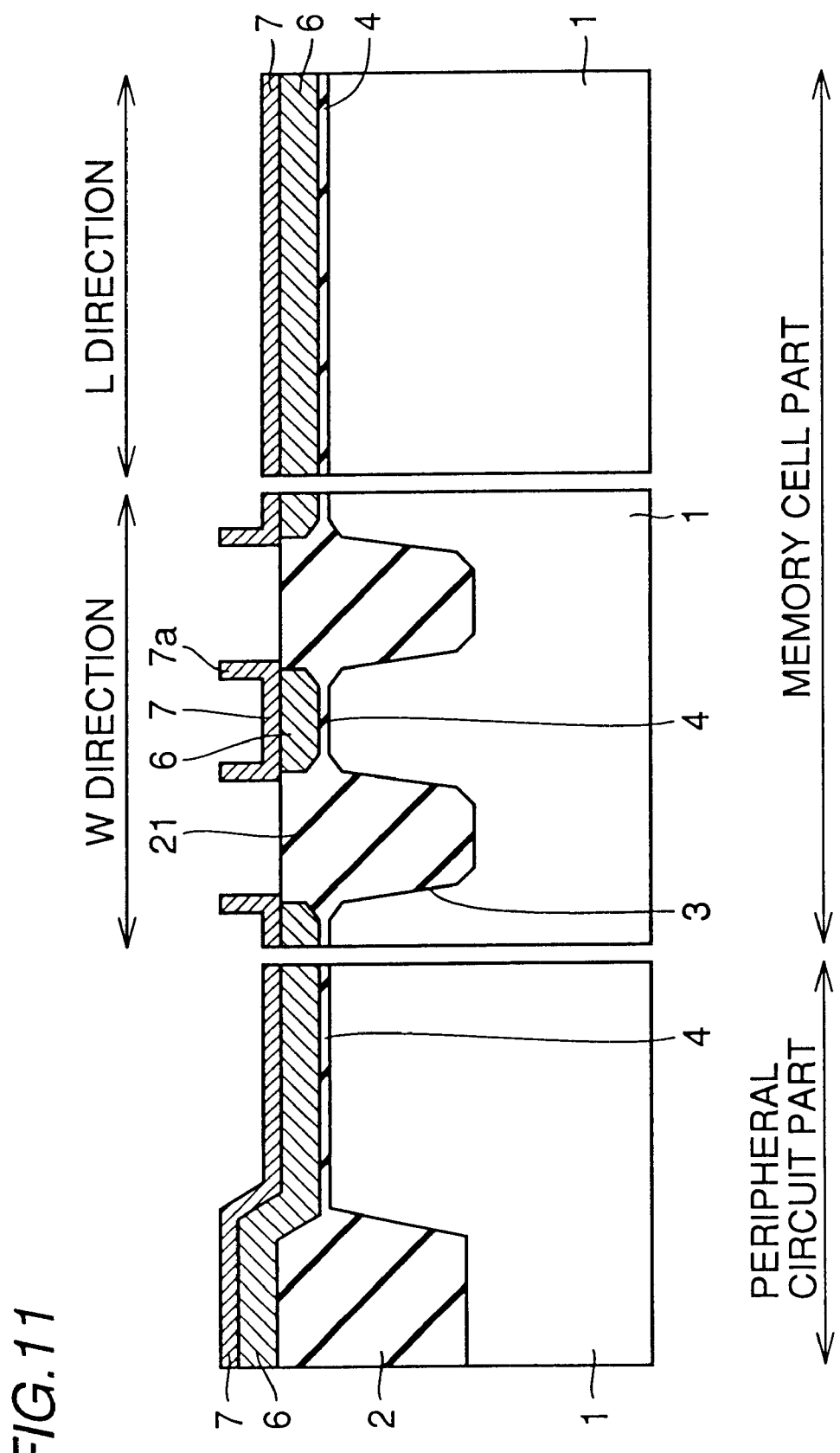

Thereafter, photoresist 22 is removed, and wet etching is effected on silicon oxide film 21 with hydrofluoric acid to remove it by a predetermined thickness. Thereby, the upper surface of silicon oxide film 21 lowers as shown in FIG. 11, and upward wall 7a is formed at doped polycrystalline silicon film 7.

Figure 12:
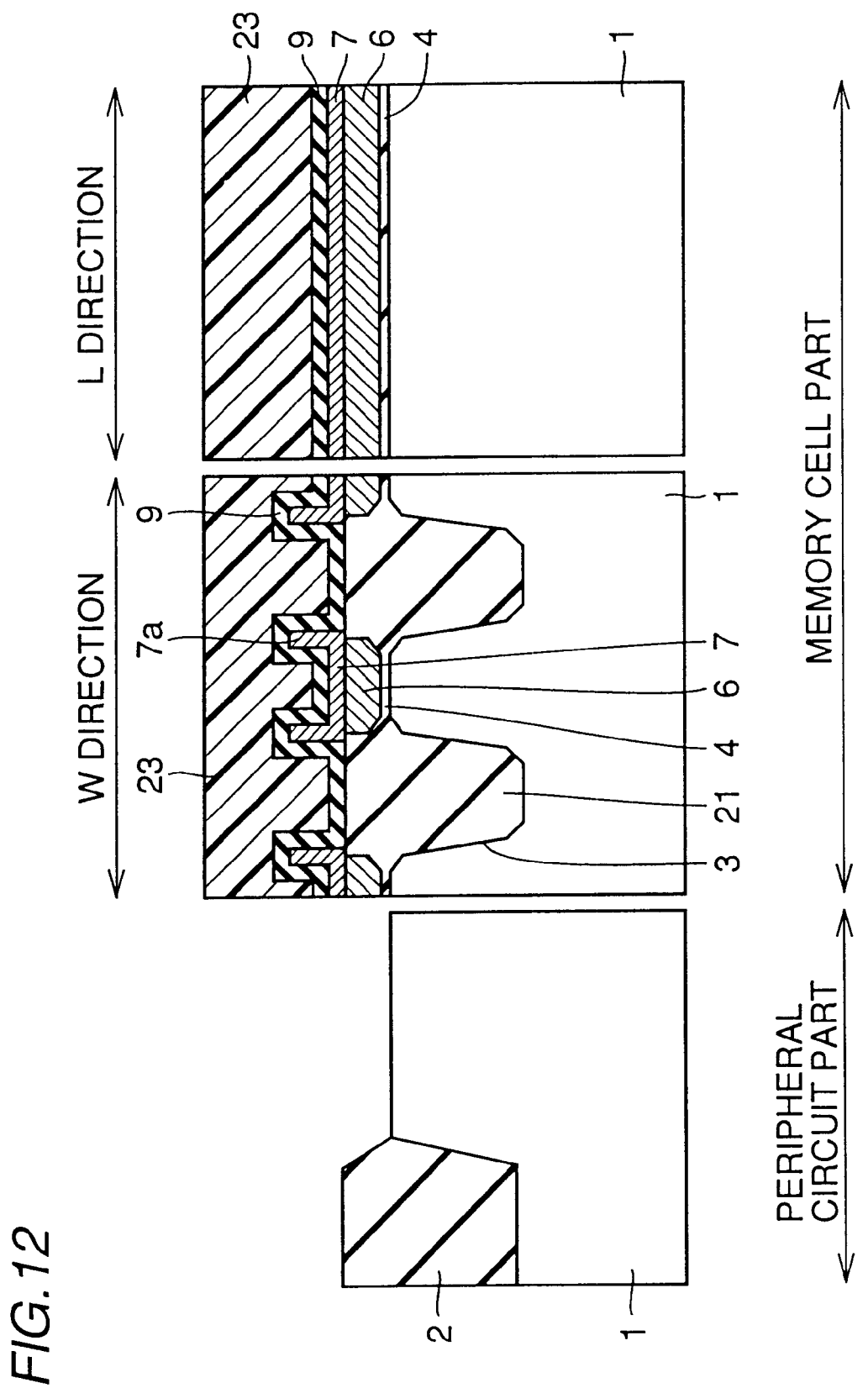

The CVD method or the like is performed to deposit insulating film (second insulating film) 9 of a three-layer structure formed of the oxide film, nitride film and oxide film. Thereby, insulating film 9 covering upward wall 7a is formed on doped polycrystalline silicon film 7 as shown in FIG. 12.

By the photolithography, photoresist 23 covering the memory cell part is formed on insulating film 9, and dry etching using photoresist 23 as a mask is performed to remove insulating film 9, doped polycrystalline silicon film 7 and doped polycrystalline silicon film 6 from the peripheral circuit part. Also, thermal oxide film 4 is removed with hydrofluoric acid.

Then, processing is performed to form a thermal oxide film 5 of about 20 nm in thickness, which will form a gate oxide film of each transistor in the peripheral circuit part. During this processing, the nitride film in insulating film 9 can prevent oxidization of the underlying layer.

Figure 13:
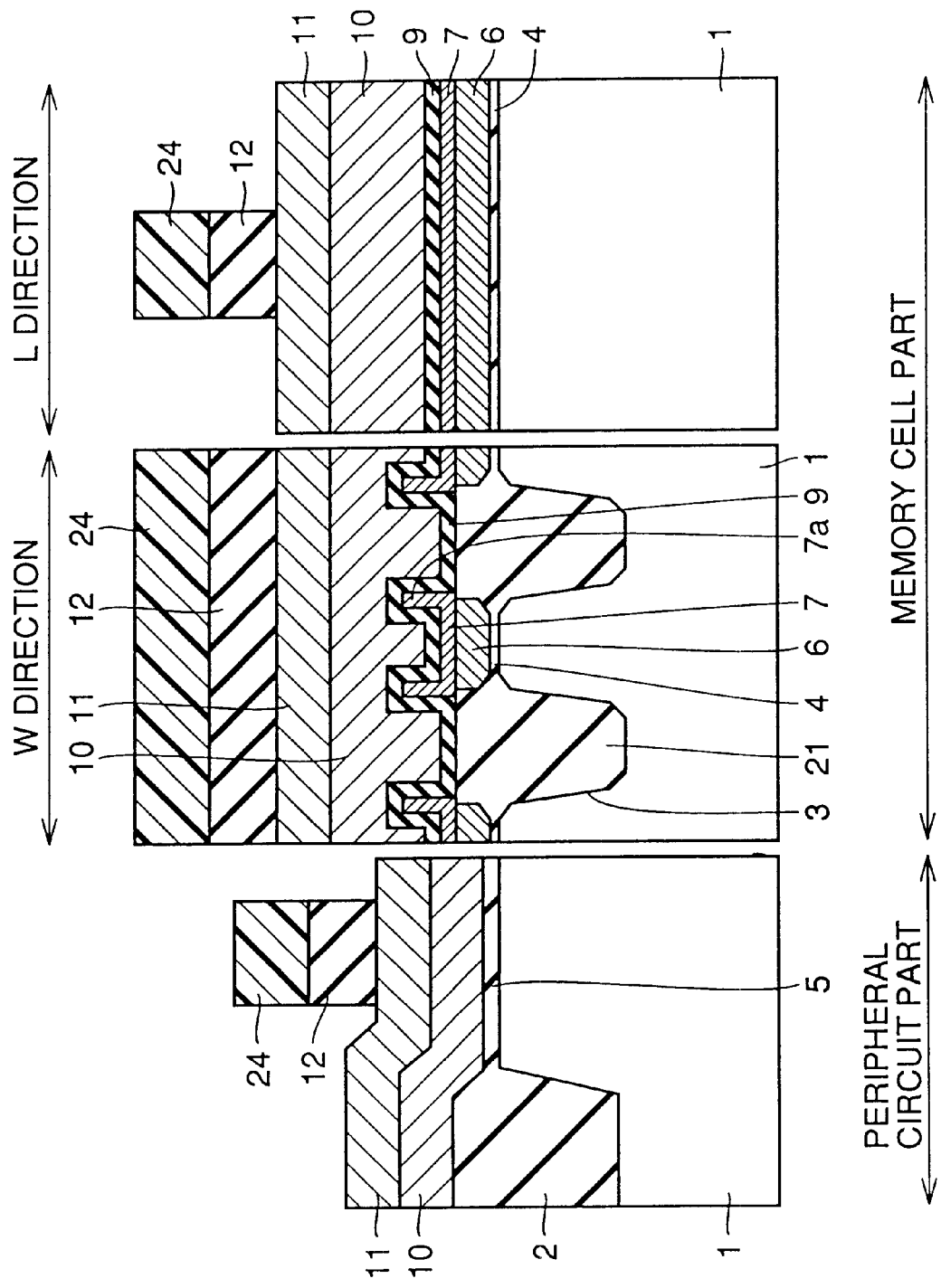

As shown in FIG. 13, the CVD method or the like is then performed to deposit successively doped polycrystalline silicon film 10 and WSi film 11, which will form gate electrode 13 of the transistor in the peripheral circuit part and control gate electrode 35 in the memory cell part, as well as silicon oxide film 12. Photoresist 24 of a predetermined configuration is formed on silicon oxide film 12 by the photolithography, and etching is effected on silicon oxide film 12 masked with photoresist 24.

After removing photoresist 24, dry etching is effected on doped polycrystalline silicon film (third conductive film) 10 and WSi film 11 masked with patterned silicon oxide film 12. Thereby, gate electrode 13 in the peripheral circuit part and control gate electrode 35 in the memory cell part are formed, as shown in FIG. 14.

Figure 14:
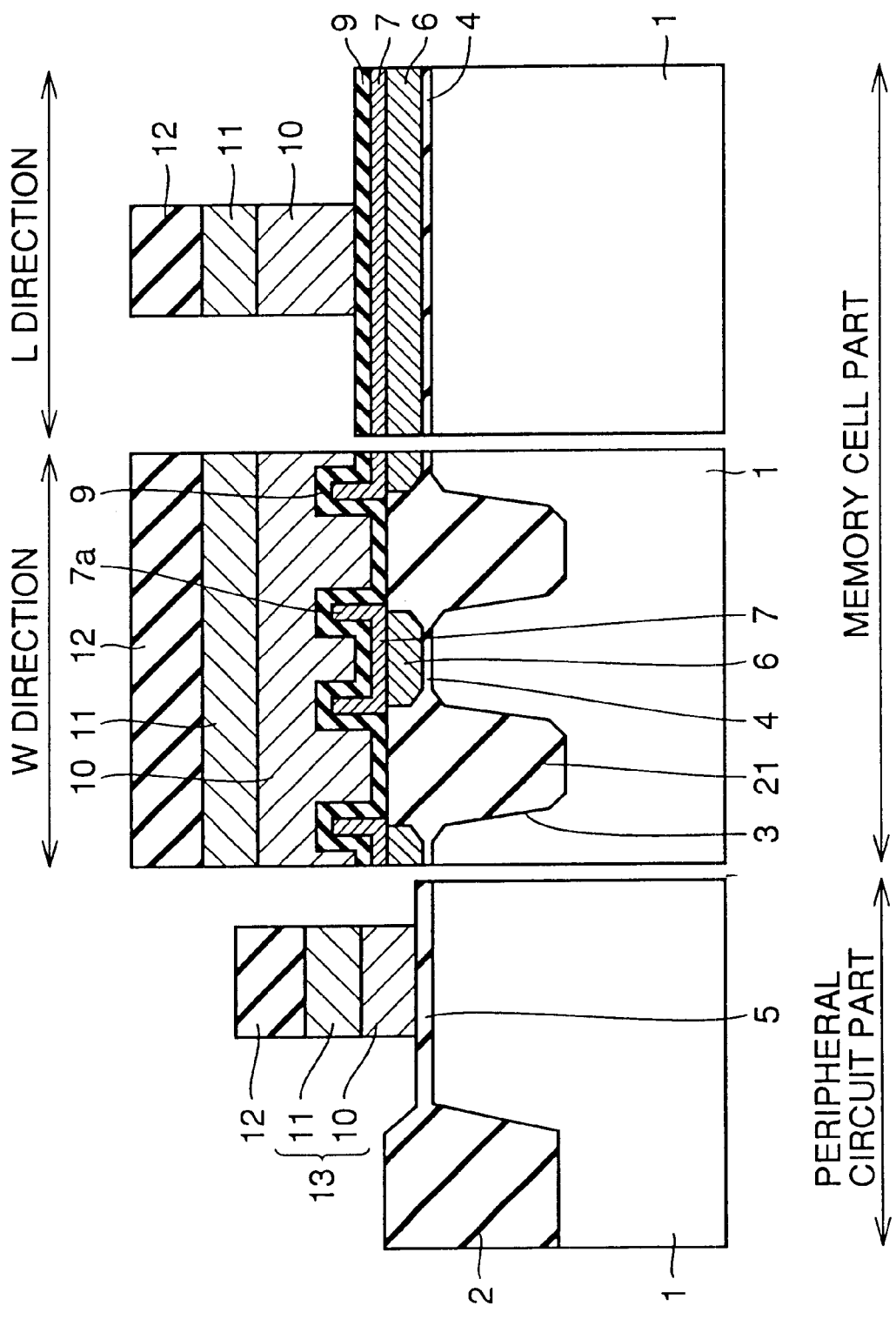

In this state, since control gate electrode 35 and insulating film 9 covering upward wall 7a of floating gate electrode 8 are formed as shown in FIG. 14, a capacitor can be formed between upward wall 7a and control gate electrode 35 so that a capacitance between floating gate electrode 8 and control gate electrode 35 can be increased.

Figure 15:
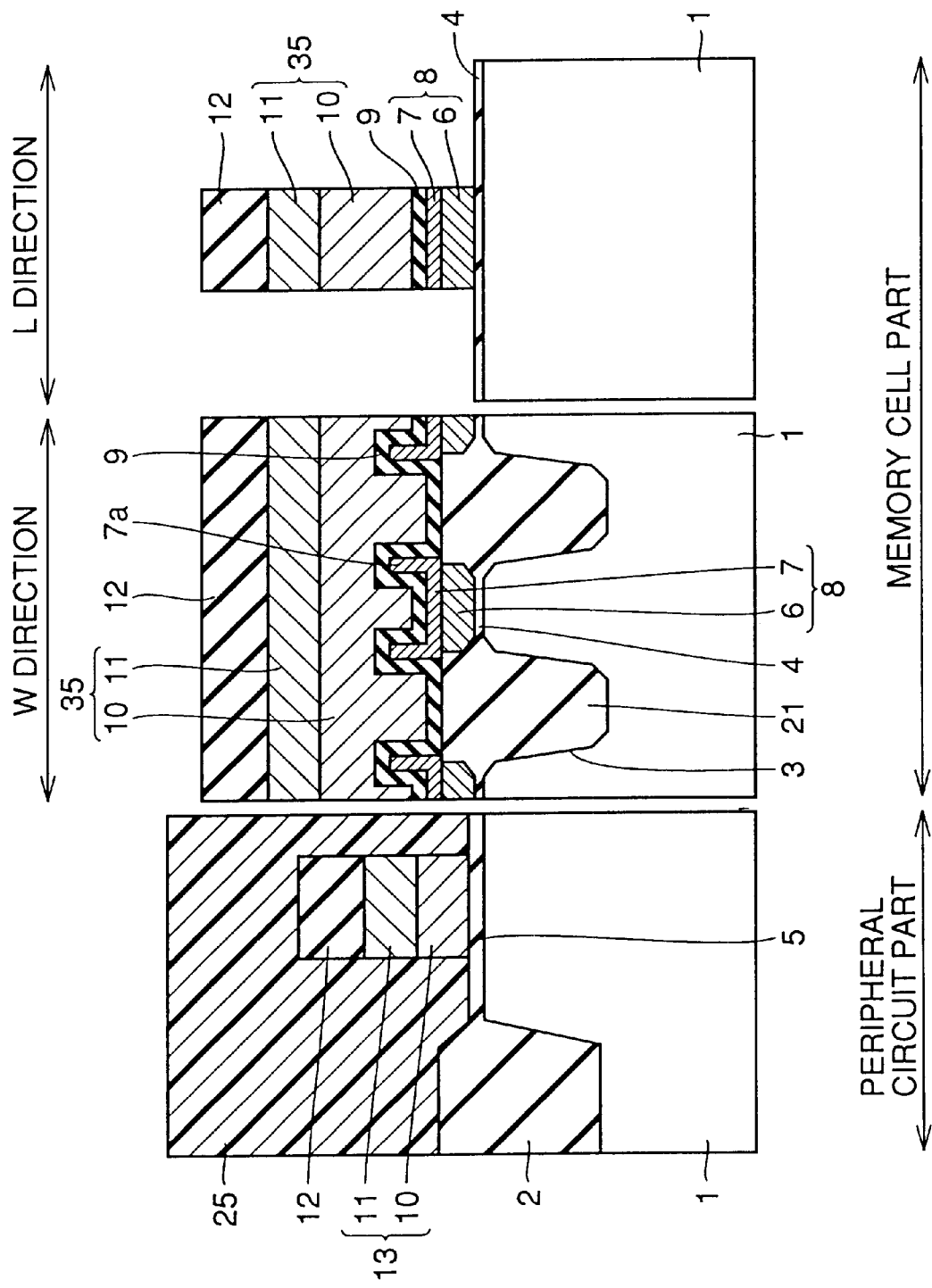

As shown in FIG. 15, photoresist 25 covering the peripheral circuit part is formed by the photolithography, and dry etching is effected on insulating film 9 and doped polycrystalline silicon films 6 and 7 in the memory cell part using photoresist 25 as a mask. Thereby, floating gate electrode 8 in the memory cell part is formed.

After the photolithography, phosphorus or arsenic ions are implanted into semiconductor substrate 1 masked with photoresist (not shown) to form the drain of each memory cell transistor.

By further performing the photolithography, photoresist (not shown) is formed to cover the peripheral circuit part and the drains of memory cell transistors, and dry etching is performed to remove silicon oxide film 21 from portions between source formation regions of the memory cell transistors in a self-aligned fashion with respect to control gate electrodes 35. Thereafter, phosphorus or arsenic ions are implanted into semiconductor substrate 1 to form sources of the memory cell transistors.

The photolithography is further performed, and phosphorus or arsenic ions are implanted into semiconductor substrate 1 masked with photoresist (not shown) to form source/drain of each n-channel transistor in the peripheral circuit part.

The photolithography is further performed, and boron ions or BF2 ions are implanted into semiconductor substrate 1 masked with photoresist (not shown) to form source/drain of each p-channel transistor in the peripheral circuit part.

The CVD method or the like is executed to deposit interlayer insulating film 14, which is formed of silicon oxide film or the like, and covers the transistors in the peripheral circuit part and the memory cell transistors. The photolithography is executed, and dry etching is effected on interlayer insulating film 14 masked with photoresist (not shown) to form contact holes 15.

Then, tungsten (W) is deposited to form a layer of about 500 nm in thickness, and etch-back is effected to form each tungsten plug 16. Then, an Al—Cu film is deposited on interlayer insulating film 14. Then, the photolithography is performed, and dry etching is effected on the Al—Cu film masked with photoresist (not shown). Thereby, interconnection film 17 is formed.

Through the foregoing steps, the nonvolatile semiconductor memory device shown in FIG. 1 can be completed.

Second Embodiment

Figure 16:
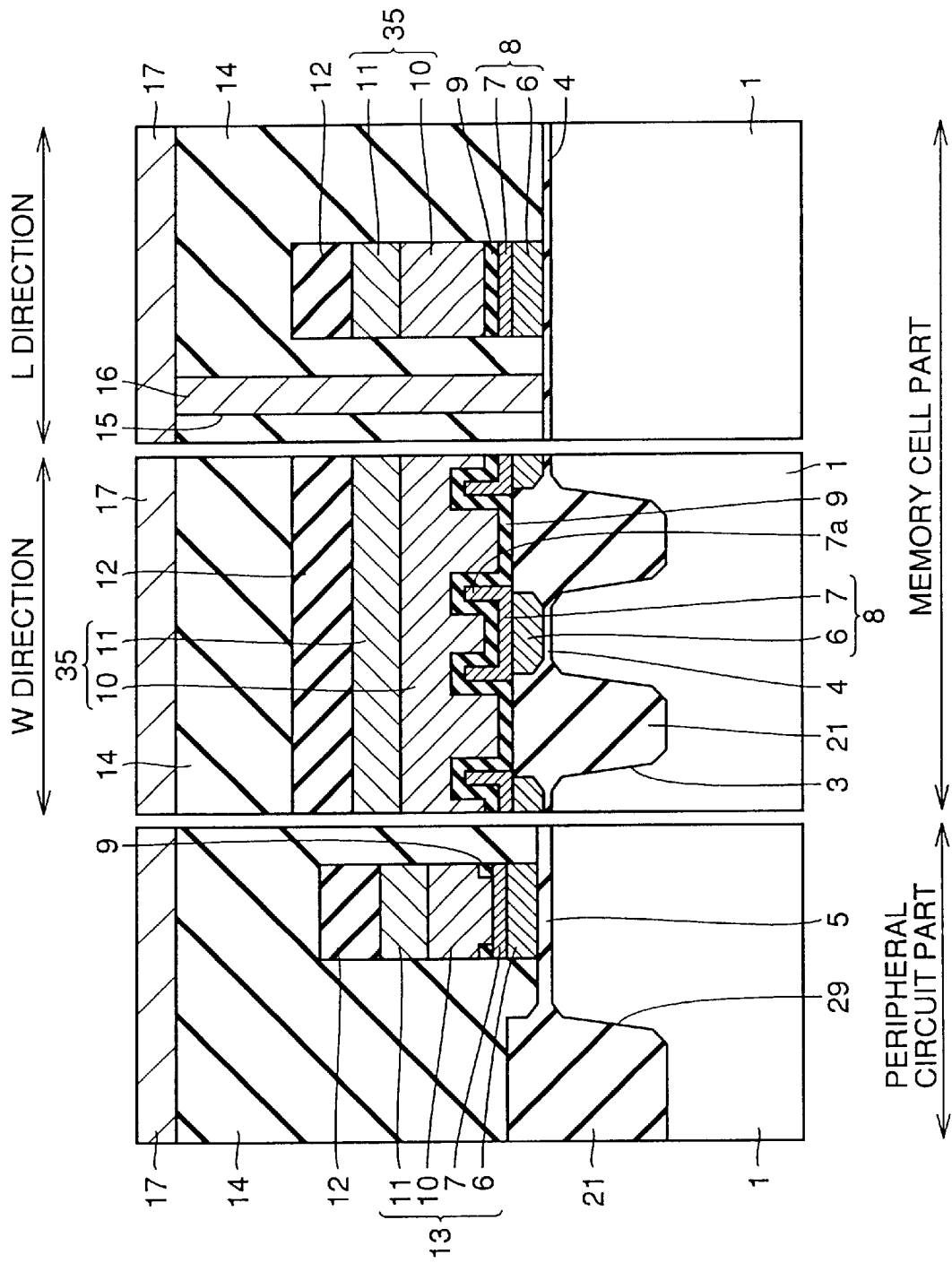
FIG. 16 is a cross section of a nonvolatile semiconductor memory device of a second embodiment of the invention.

A second embodiment of the invention will now be described with reference to FIGS. 16 to 32. FIG. 16 is a cross section of a nonvolatile semiconductor memory device of the second embodiment.

As shown in FIG. 16, the nonvolatile semiconductor memory device of this embodiment is provided at the peripheral circuit part with a trench 29, in which a silicon oxide film (fourth insulating film) 21 is formed. Further, gate electrode 13 of the transistor in the peripheral circuit part has a multilayer structure formed of doped polycrystalline silicon films 6, 7 and 10 and WSi film 11. Structures other than the above are the substantially same as those of the first embodiment, and description thereof is not repeated.

In the second embodiment, since floating gate electrode 8 has upward wall 7a, effects similar to those of the first embodiment can be achieved.

Referring to FIGS. 17–32, description will now be given on a method of manufacturing the nonvolatile semiconductor memory device of the second embodiment.

Figure 17:
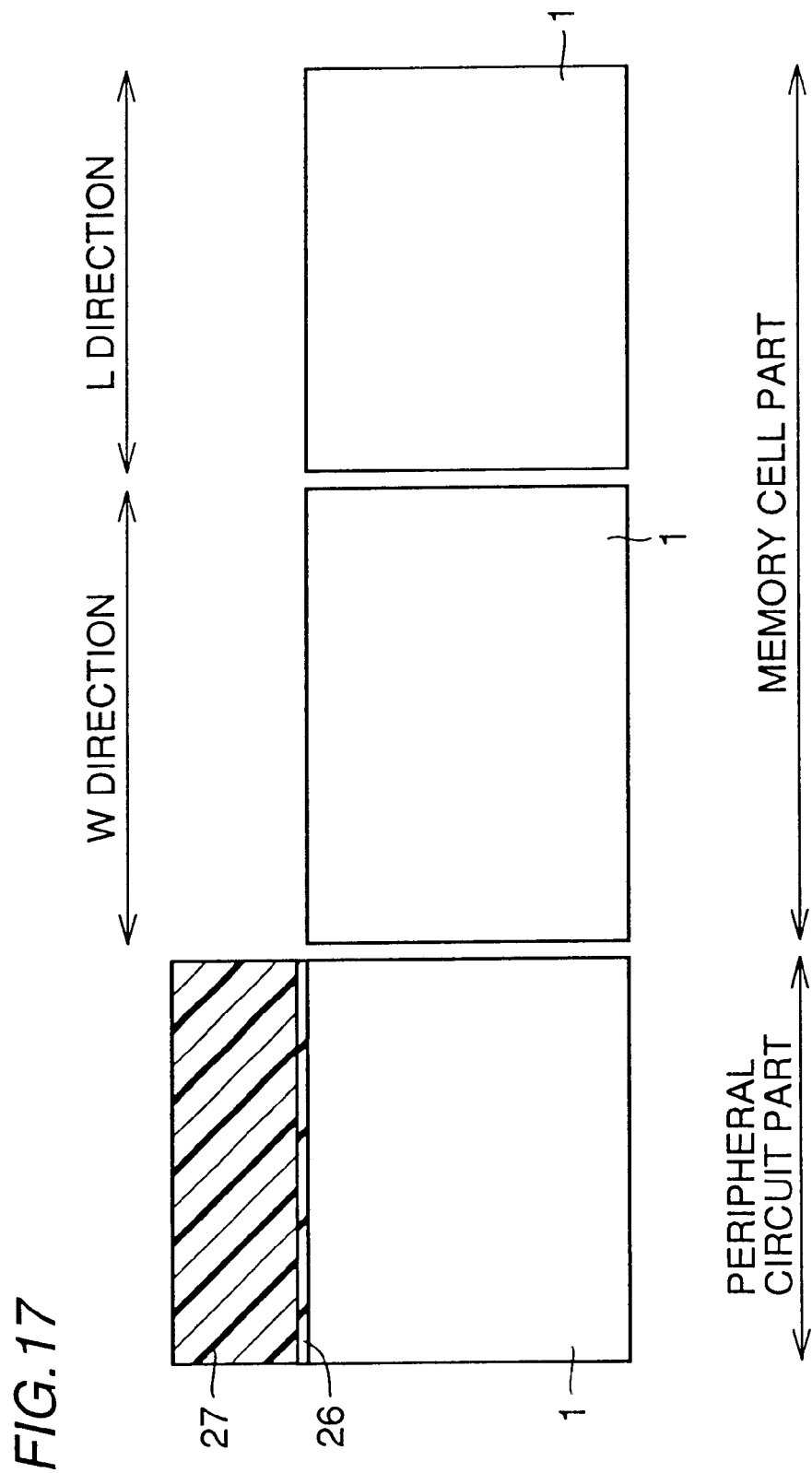
FIGS. 17–32 are cross sections showing 1st to 16th steps in a process of manufacturing the nonvolatile semiconductor memory device shown in FIG. 16, respectively.

After forming n- and p-well regions in semiconductor substrate 1, a thermal oxide film 26 of about 10 nm in thickness is formed. As shown in FIG. 17, photoresist 27 covering the peripheral circuit part is formed on thermal oxide film 26 by the photolithography, and thermal oxide film 26 masked with photoresist 27 is selectively removed with hydrofluoric acid.

After removing photoresist 27, processing is performed to form thermal oxide film 4 of about 10 nm in thickness, which will form the tunnel insulating film in the memory cell part. In the peripheral circuit part, the above processing further oxidizes thermal oxide film 26 so that thermal oxide film 5 thicker than thermal oxide film 4 is formed. This thermal oxide film 5 will form the gate insulating film of the transistor in the peripheral circuit part.

Figure 18:
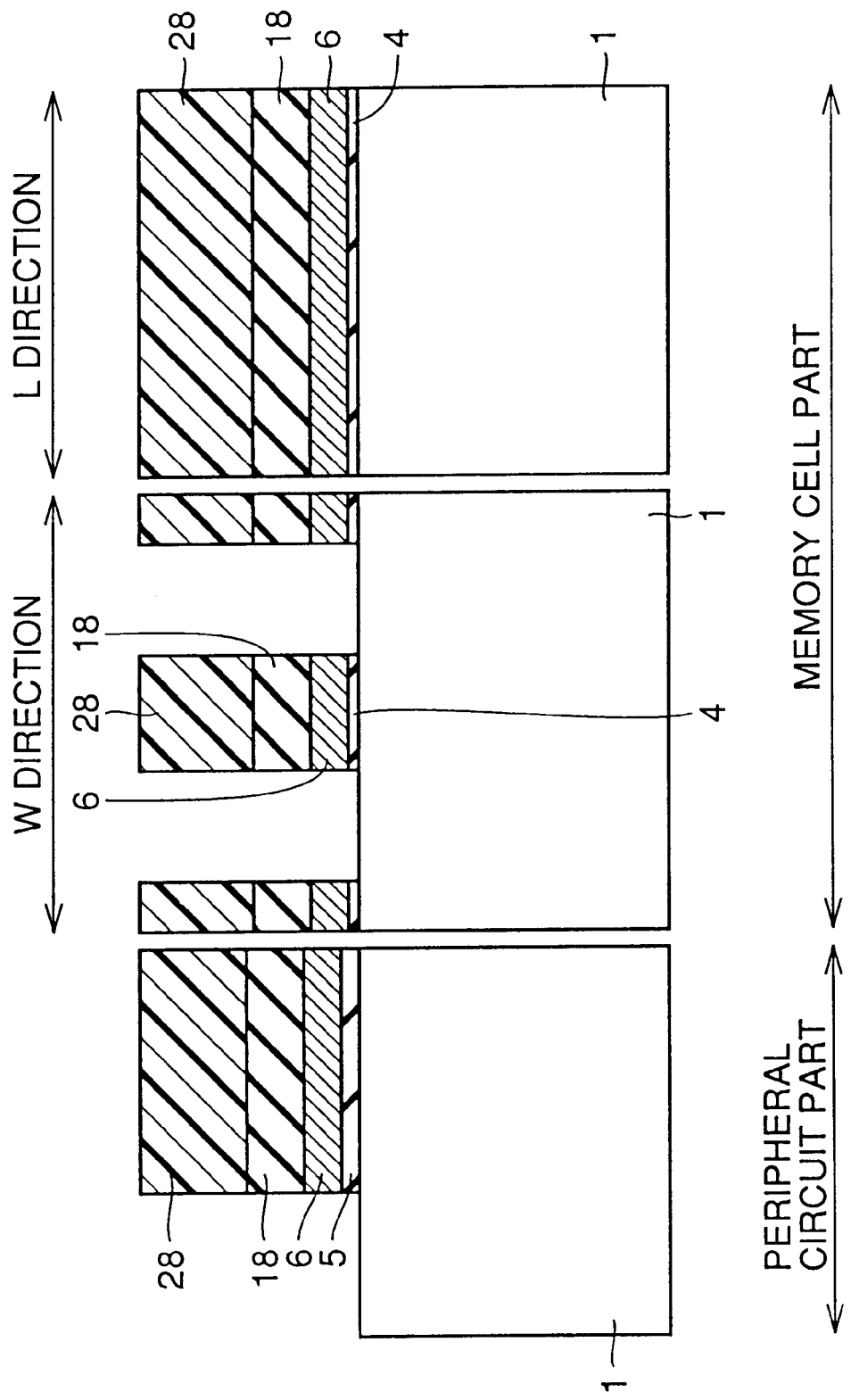

Then, doped polycrystalline silicon film 6 and silicon nitride film 18 are deposited in the same manner as the first embodiment, and photoresist 28 of a predetermined configuration is formed on silicon nitride film 18 by the photolithography. Using photoresist 28 as a mask, dry etching is effected on silicon nitride film 18, doped polycrystalline silicon film 6 and thermal oxide films 4 and 5 as shown in FIG. 18. Thereby, the regions, in which trenches for element isolation are to be formed, are exposed in the memory cell part and the peripheral circuit part.

Figure 19:
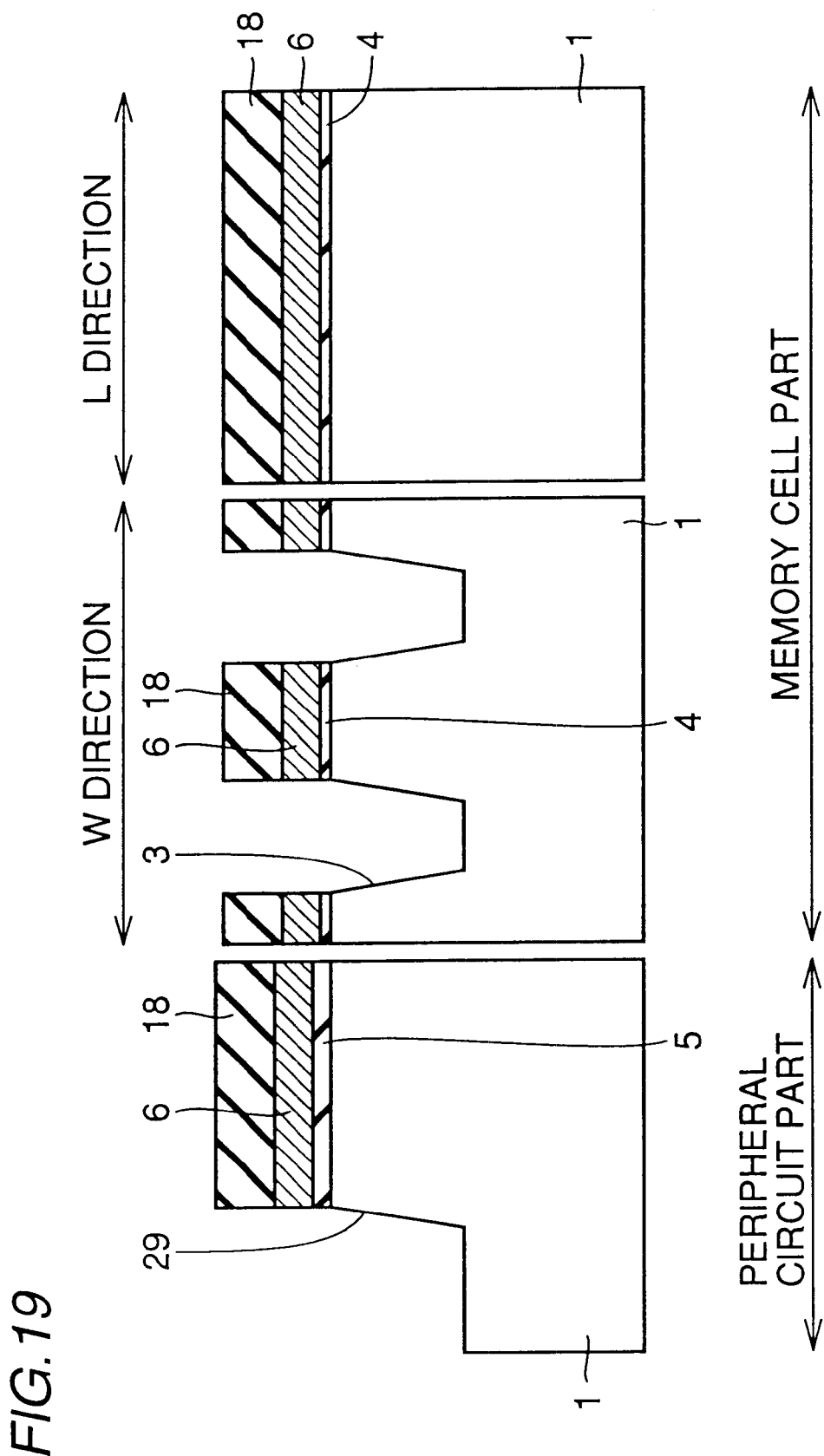

After removing photoresist 28, dry etching is effected on semiconductor substrate 1 masked with patterned silicon nitride film 18, doped polycrystalline silicon film 6 and thermal oxide films 4 and 5. Thereby, trenches 3 and 29 each having a depth of about 400 nm are formed as shown in FIG. 19.

As described above, trenches 3 and 29 in the memory cell part and the peripheral circuit part are formed through the same steps so that the process can be simple.

Figure 20:
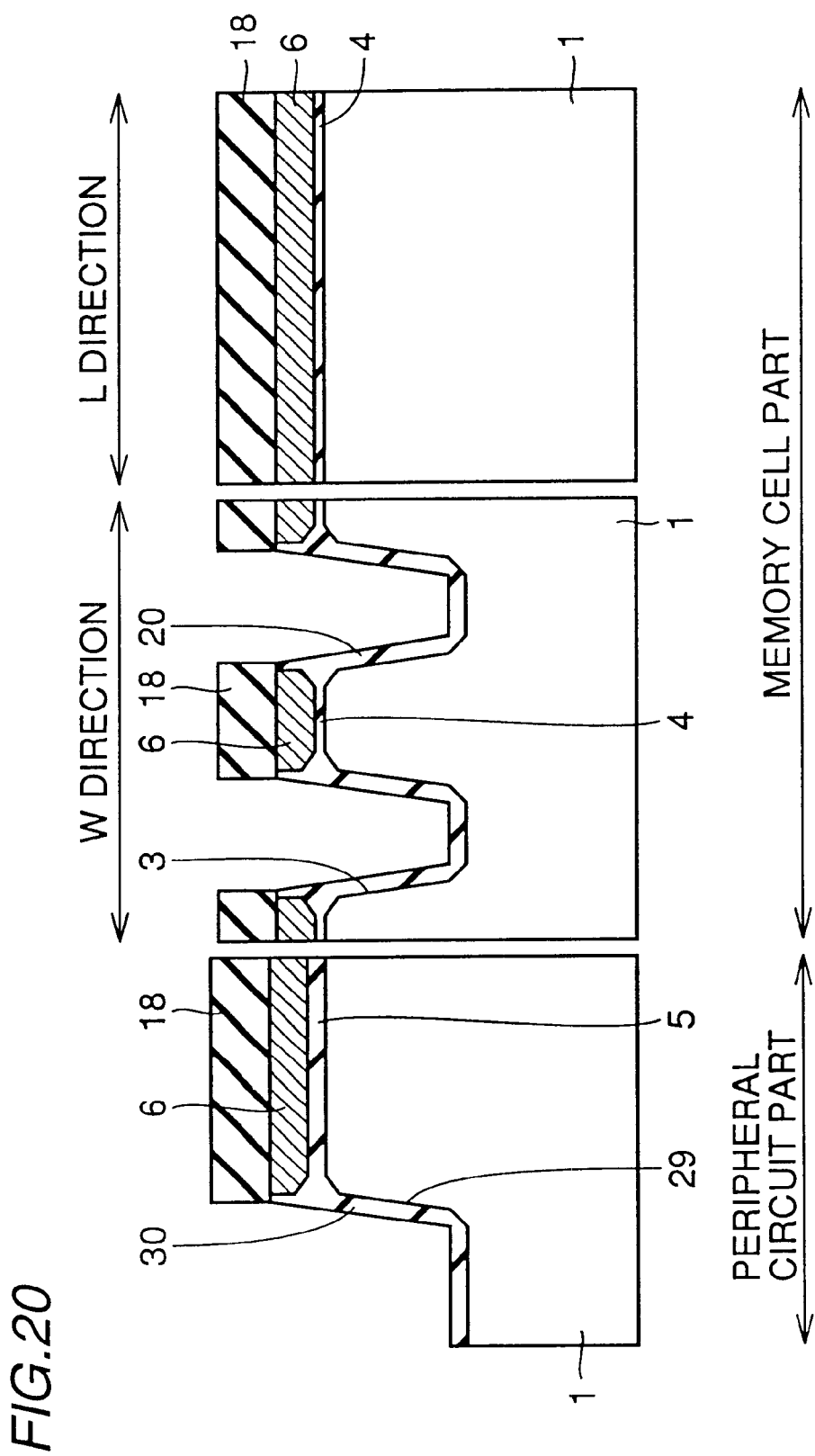
Figure 21:
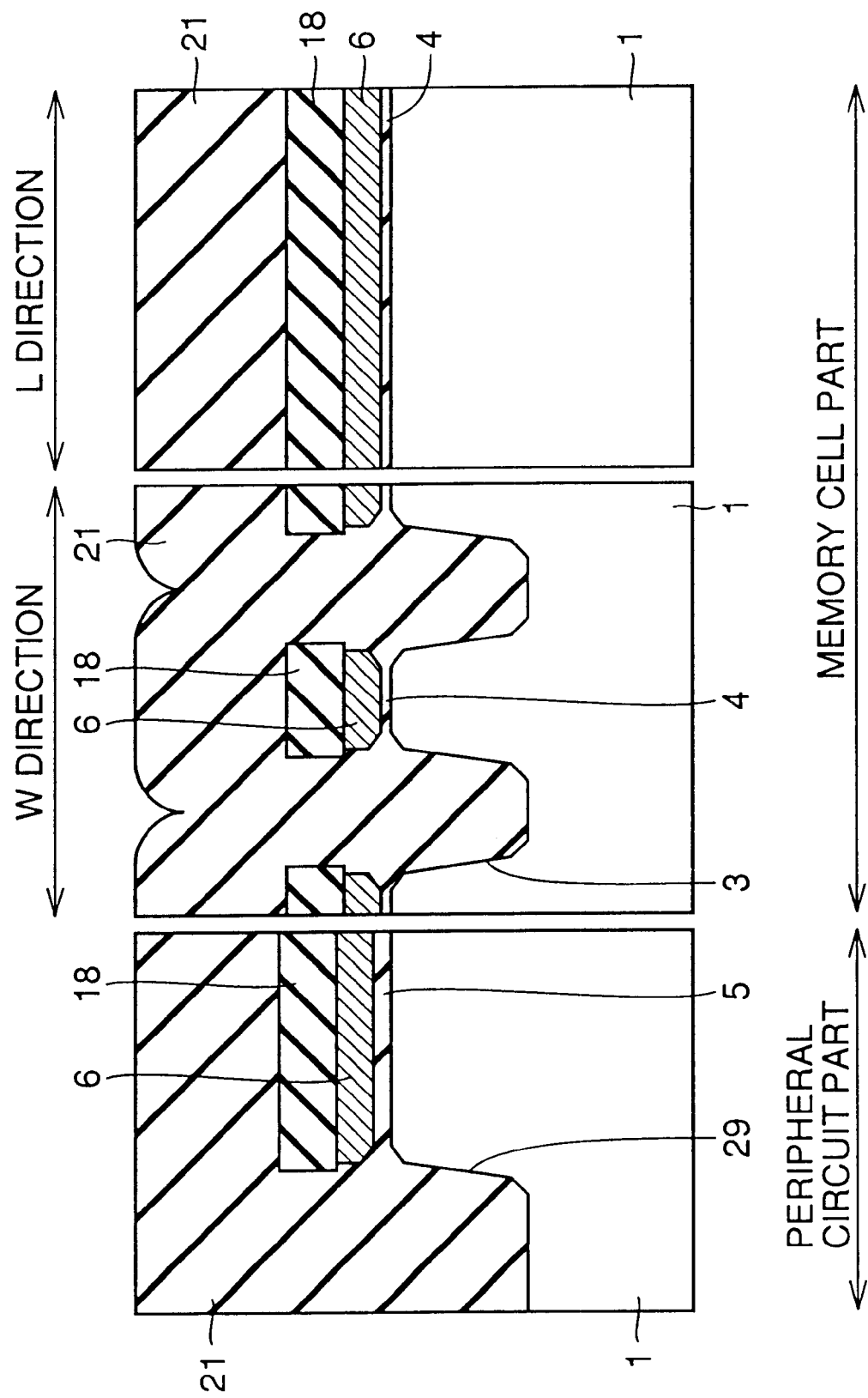

As shown in FIG. 20, thermal oxidization is then effected on the inner surfaces of trenches 3 and 29 to form thermal oxide films 20 and 30 of about 50 nm in thickness, respectively, and silicon oxide film 21 of about 500 nm in thickness is deposited as shown in FIG. 21. Thereby, trenches 3 and 29 are filled with silicon oxide film 21.

Figure 22:
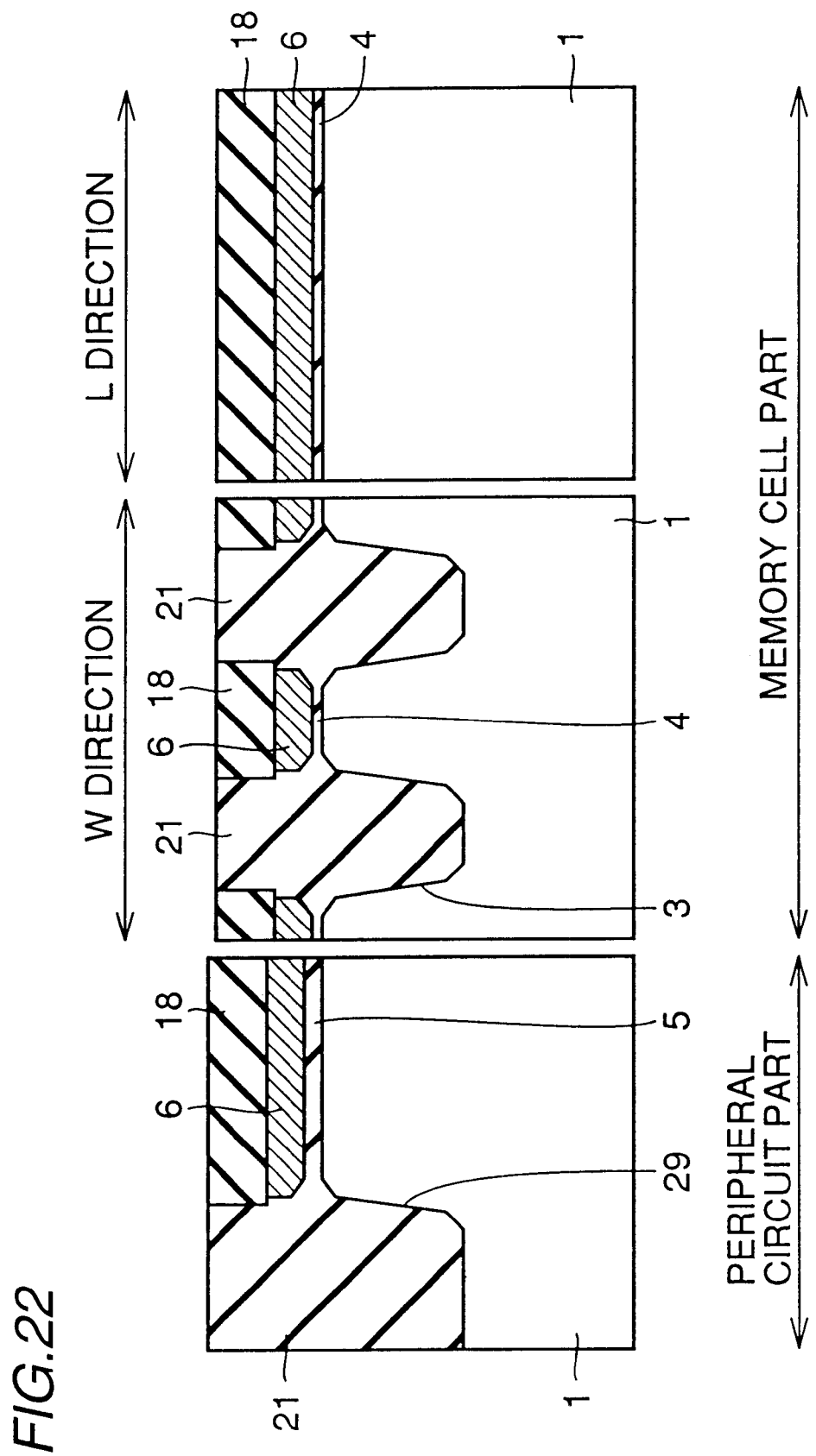
Figure 23:
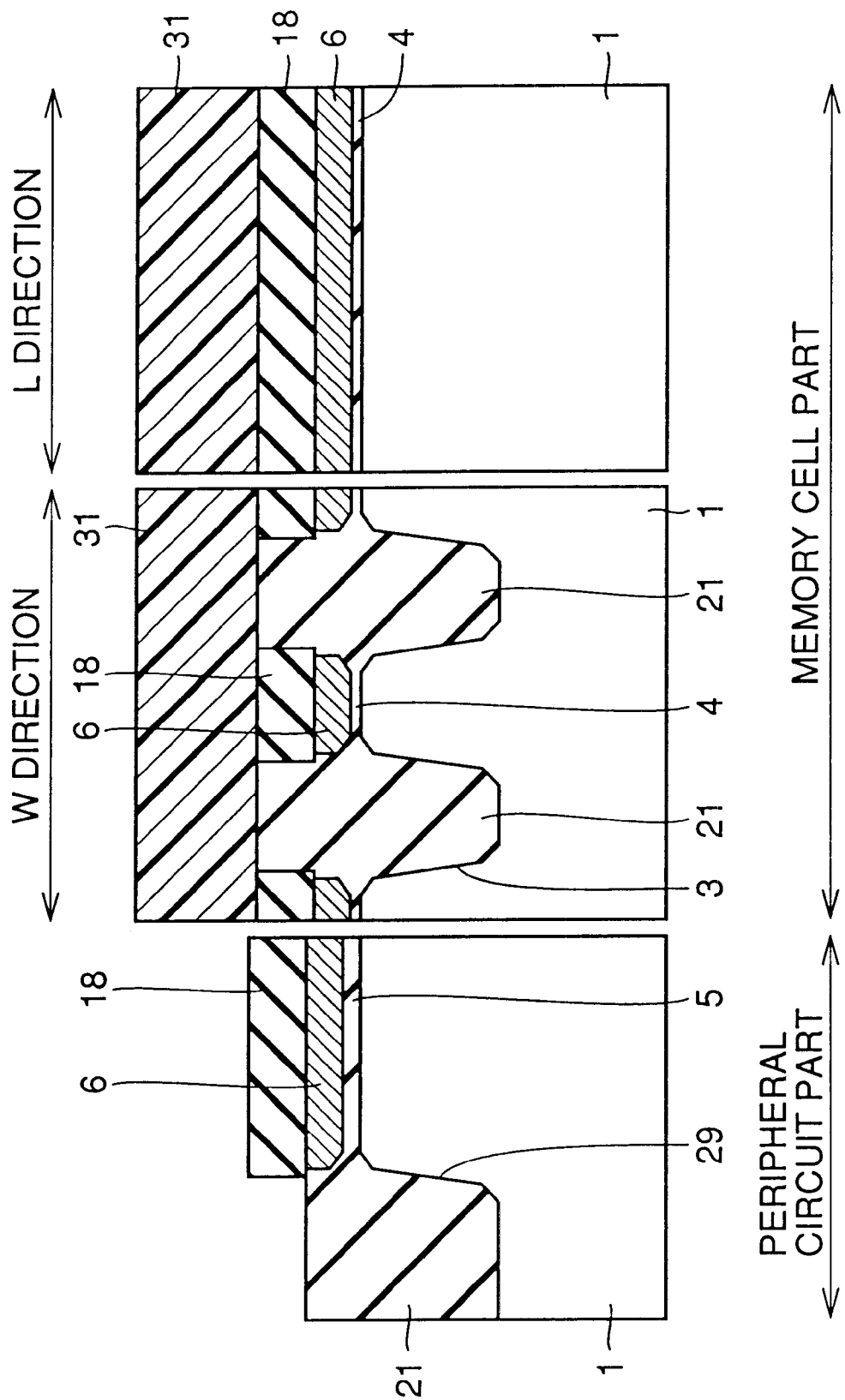

Similarly to the first embodiment, CMP is then effected on silicon oxide film 21 to expose silicon nitride film 18 as shown in FIG. 22. Thereafter, photoresist 31 covering the memory cell part is formed by the photolithography as shown in FIG. 23. Using photoresist 31 as a mask, wet etching is effected on silicon oxide film 21 in trench 29 with hydrofluoric acid to remove it by a predetermined amount. Thereby, the upper surface of silicon oxide film 21 in trench 29 is lowered.

Figure 24:
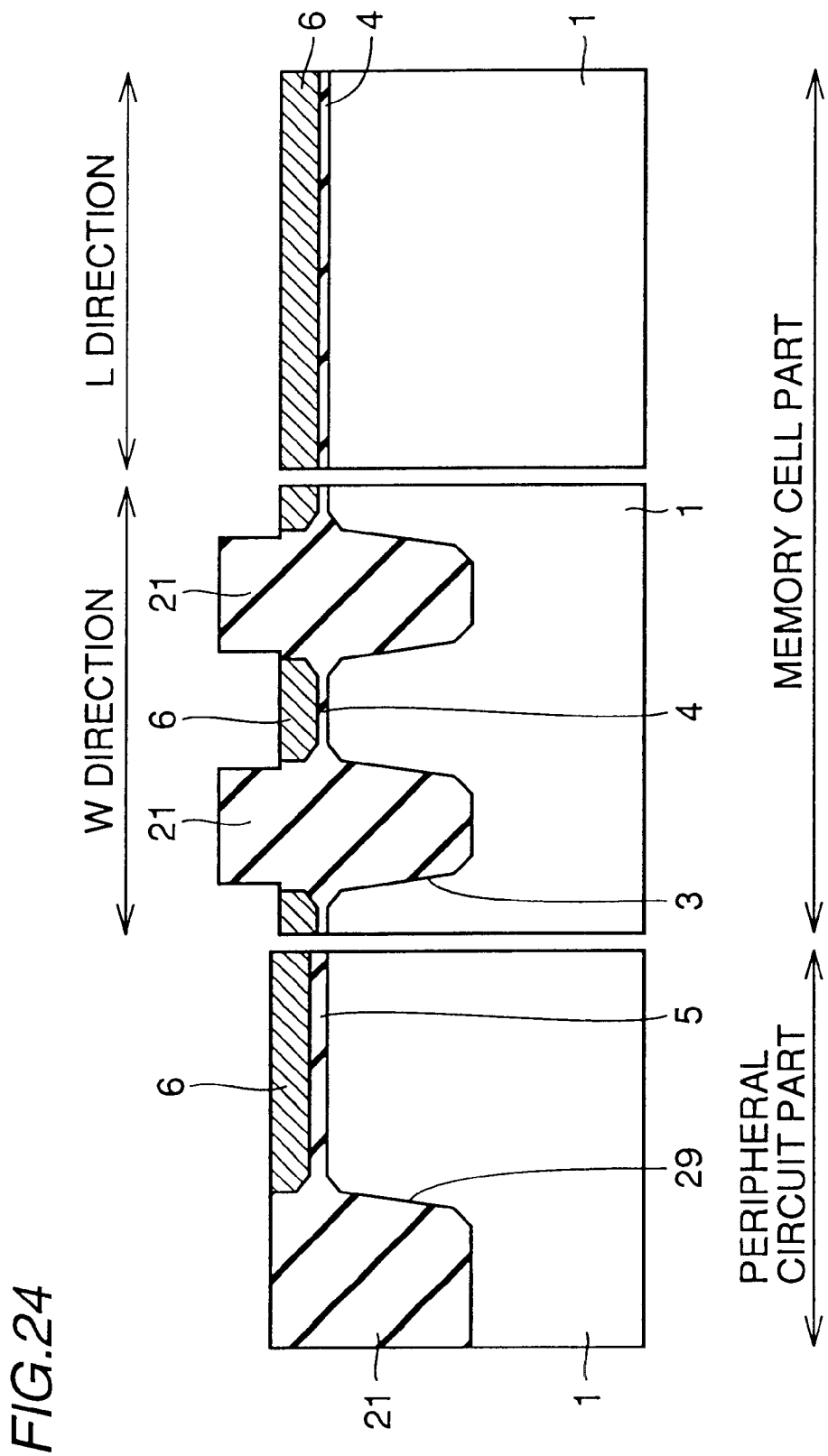

After removing photoresist 31, silicon nitride film 18 is removed with thermal phosphoric acid as shown in FIG. 24. Thereby, the trench isolation (STI) is formed. In this state, silicon oxide film 21 formed in trench 3 of the memory cell part has a convexity, which projects upward beyond the upper surface of doped polycrystalline silicon film 6, but silicon oxide film 21 formed in trench 29 of the peripheral circuit part does not have a convexity. However, depending on the etched amount of silicon oxide film 21 in trench 29, silicon oxide film 21 may have the convexity projecting upward from the upper surface of doped polycrystalline silicon film 6.

Figure 25:
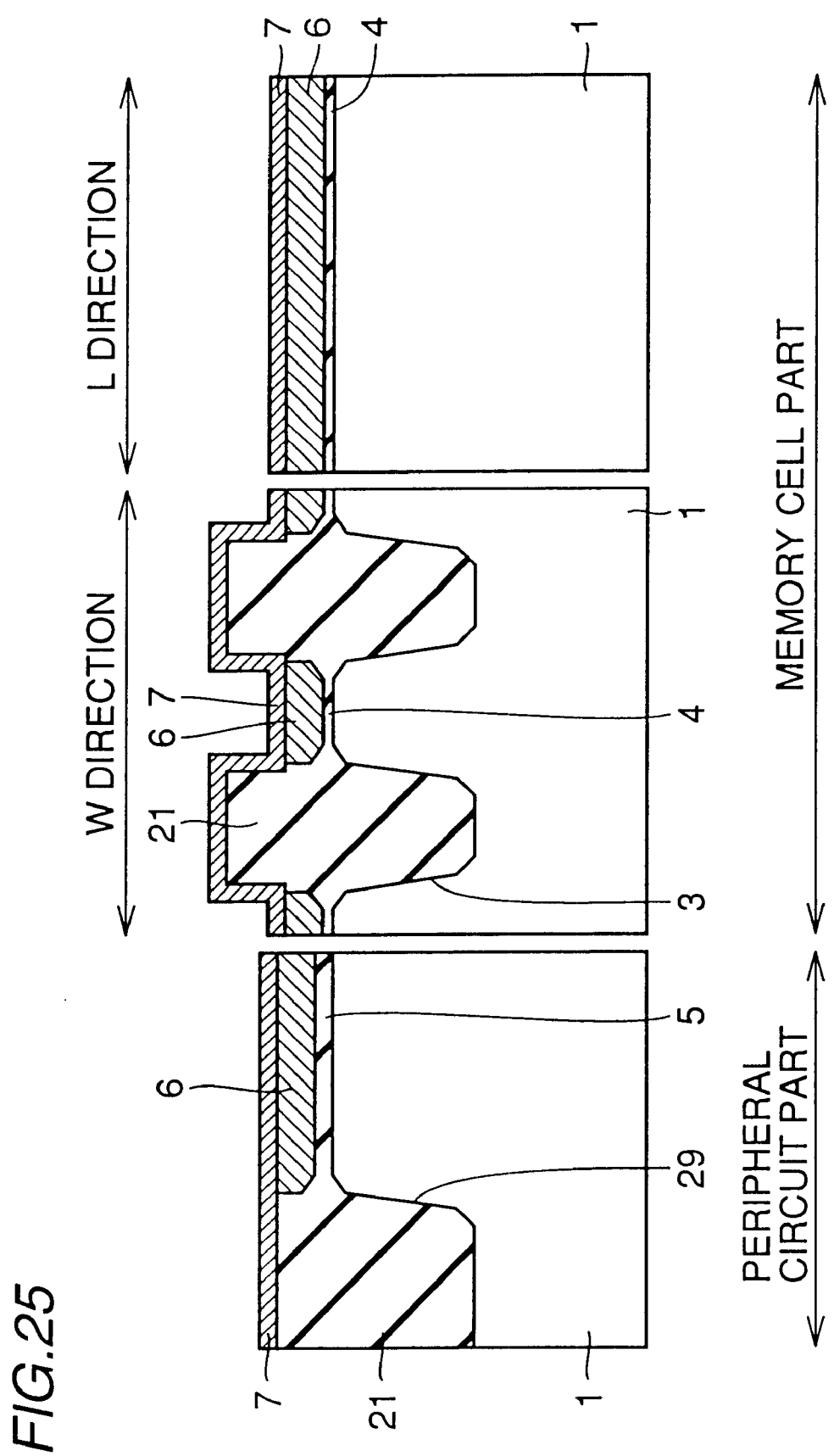
Figure 26:
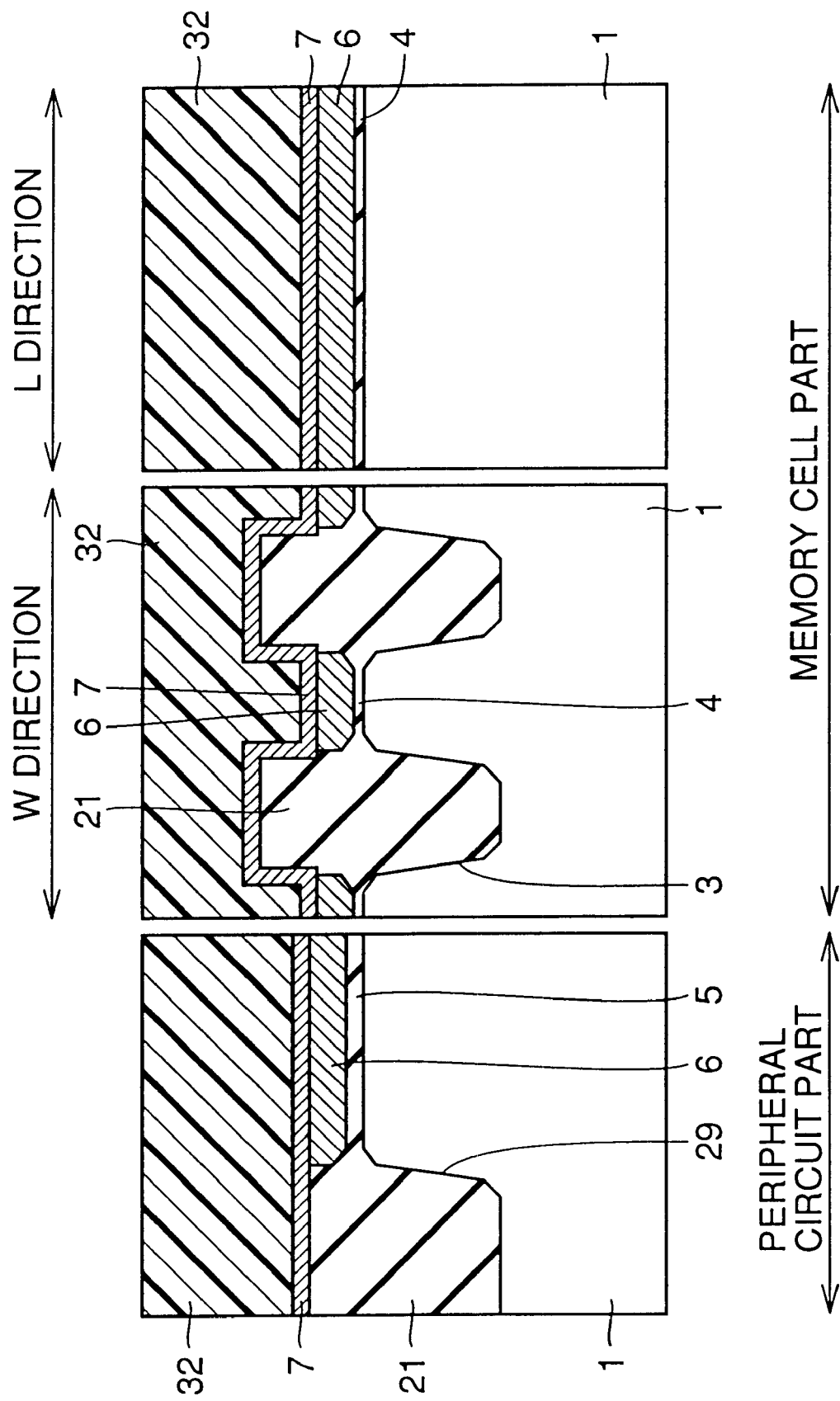
Figure 27:
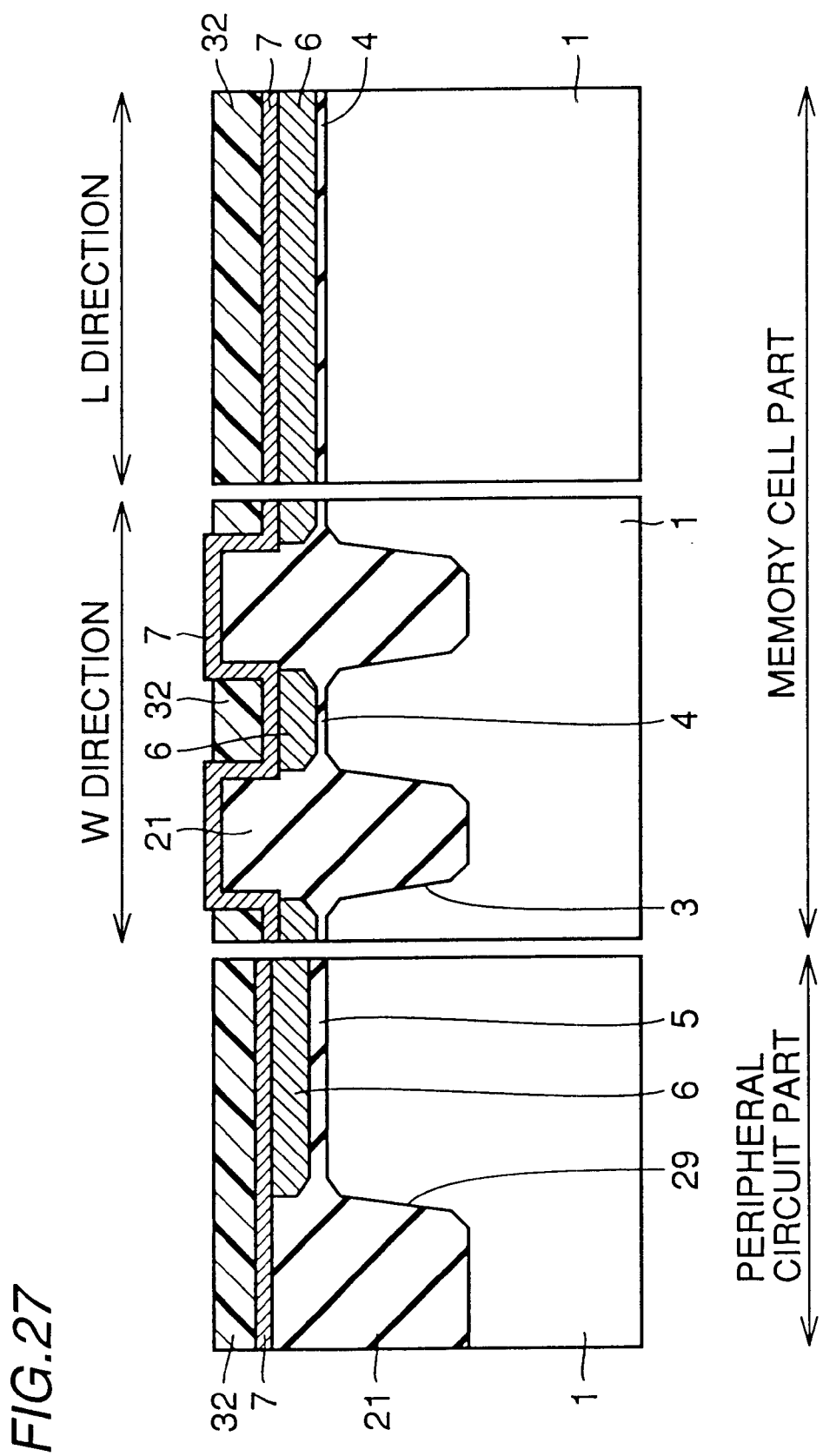
Figure 28:
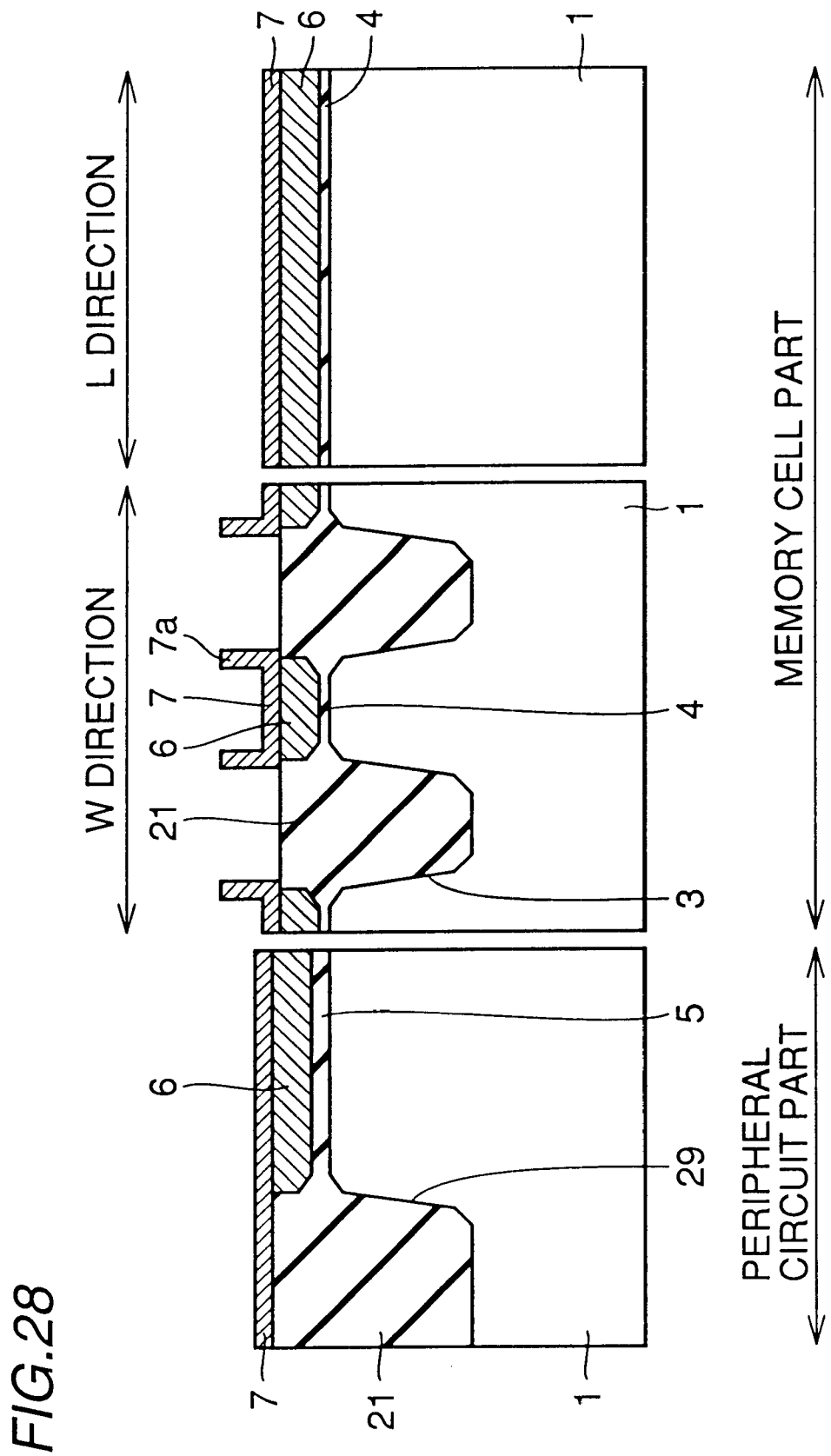
Figure 29:
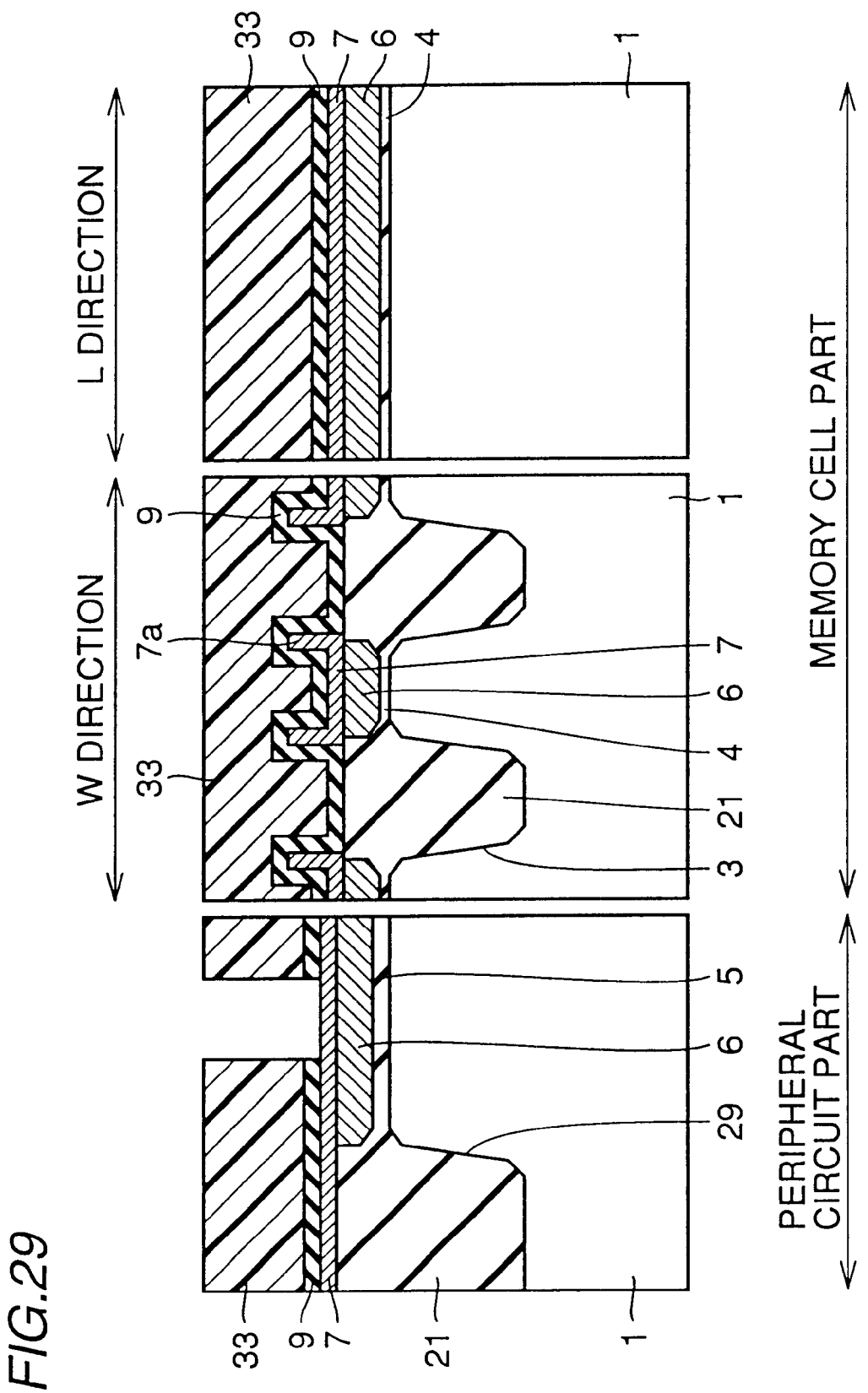

Then, doped polycrystalline silicon film 7 is deposited in a manner similar to that of the first embodiment as shown in FIG. 25, and photoresist 32 is applied onto doped polycrystalline silicon film 7 as shown in FIG. 26. Then, whole surface exposure and development are effected (see FIG. 27), and etch-back is effected on doped polycrystalline silicon film 7 masked with photoresist 32 remaining on doped polycrystalline silicon film 6 so that upward wall 7a is formed as shown in FIG. 28.

Then, photoresist 32 is removed, and wet etching is effected on silicon oxide film 21 in trench 3 with hydrofluoric acid by a predetermined extent. Thereafter, insulating film 9 is formed in a manner similar to that of the first embodiment, and photoresist 33 of a predetermined configuration is formed on insulating film 9 by photolithography.

Photoresist 33 has an opening located above the gate electrode formation region of each transistor in the peripheral circuit part. Dry etching is effected on insulating film 9 masked with photoresist 33 so that the surface of doped polycrystalline silicon film 7 is exposed in the gate electrode formation region of the transistor in the peripheral circuit part.

Figure 30:
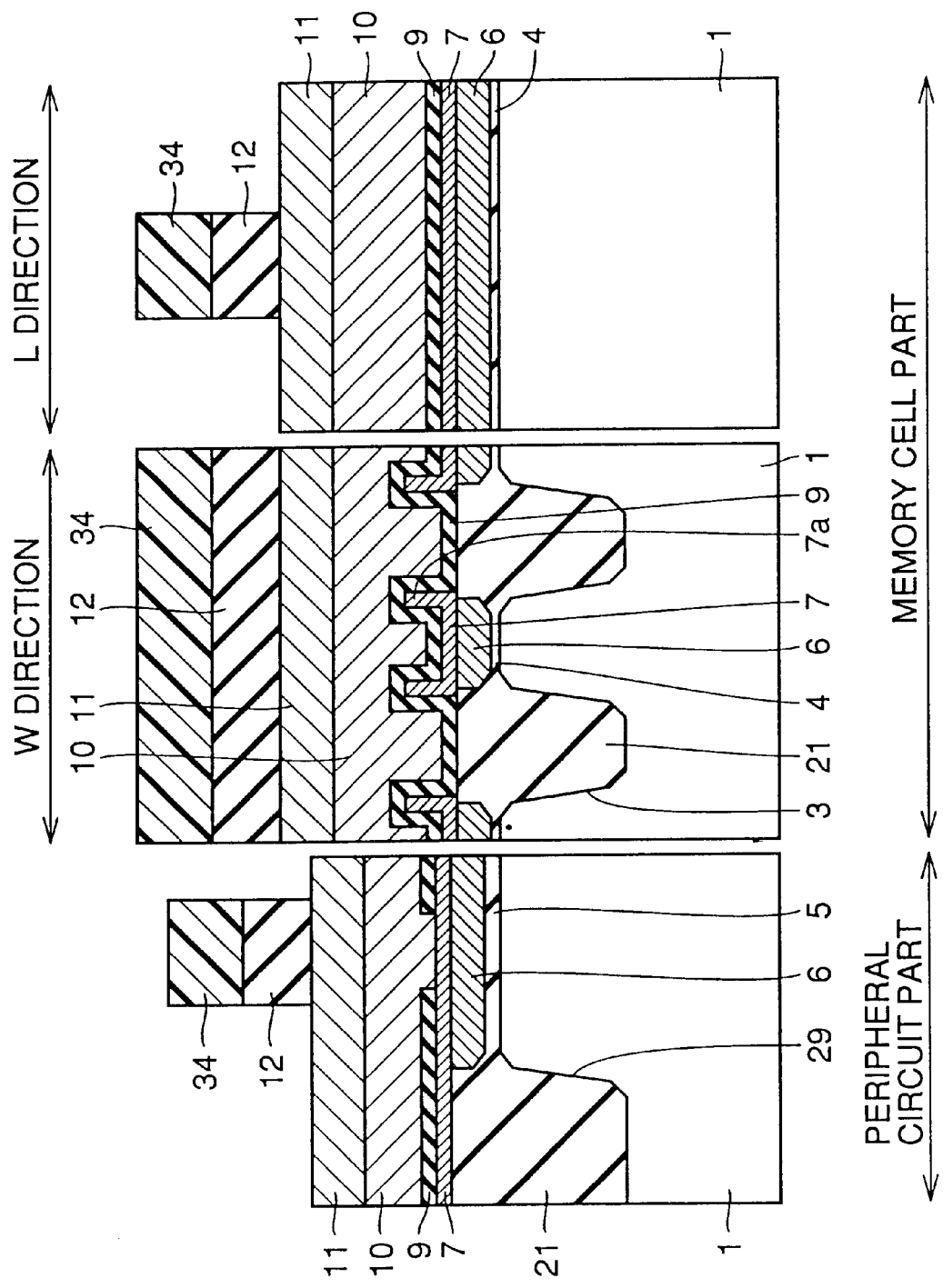

After removing photoresist 33, doped polycrystalline silicon film 10, WSi film 11 and silicon oxide film 12 are deposited in a manner similar to that of the first embodiment. In this step, the peripheral circuit part enters such a state that doped polycrystalline silicon films 10 and 7 are in contact with each other in the region, where insulating film 9 is removed, as shown in FIG. 30, and are electrically connected so that doped polycrystalline silicon films 6 and 7 form the lower level gate electrode of the transistor in the peripheral circuit part.

By the photolithography, photoresist 34 of a predetermined configuration is formed on silicon oxide film 12, and dry etching is effected on silicon oxide film 12 masked with photoresist 34.

Figure 31:
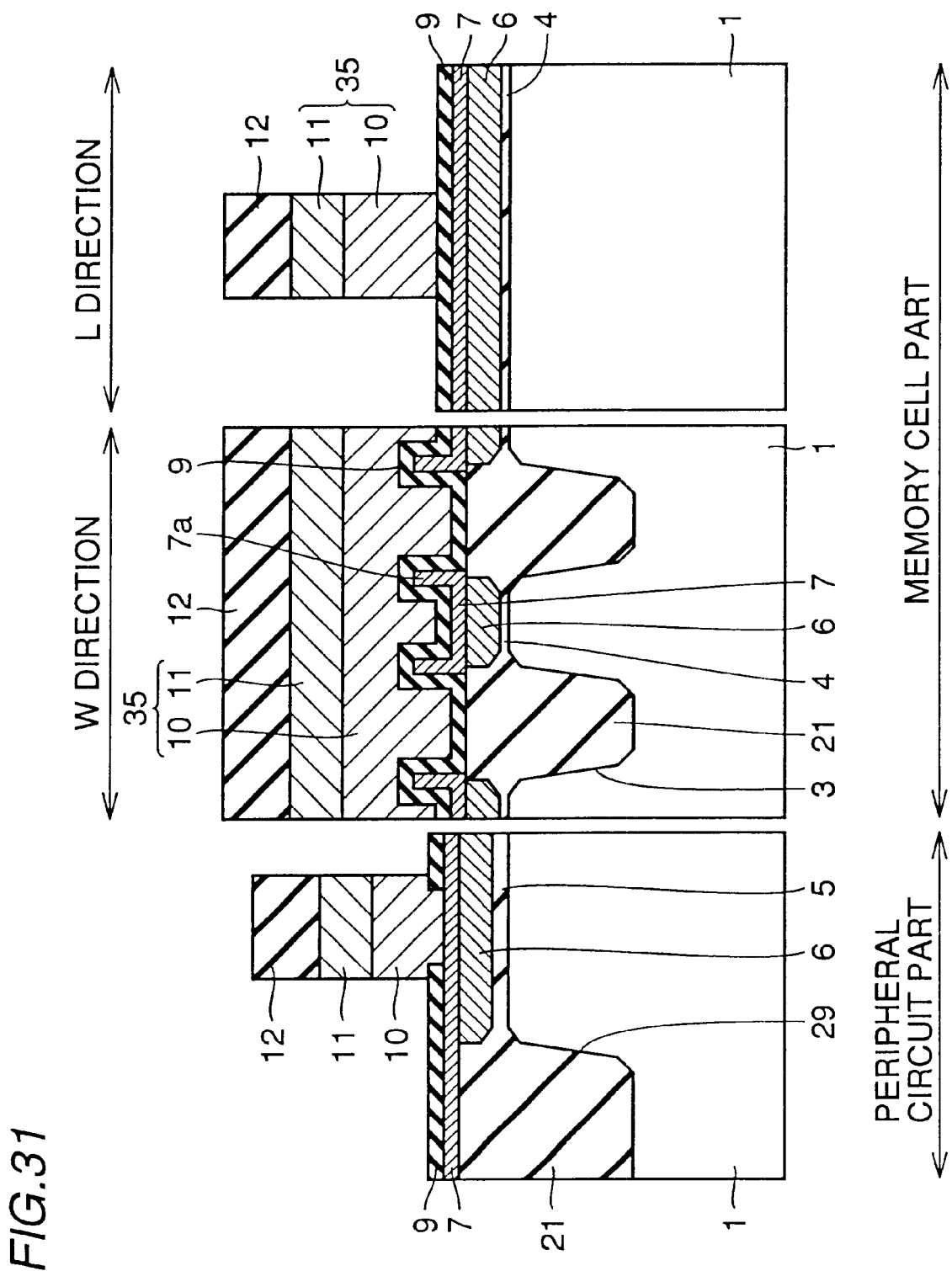
Figure 32:
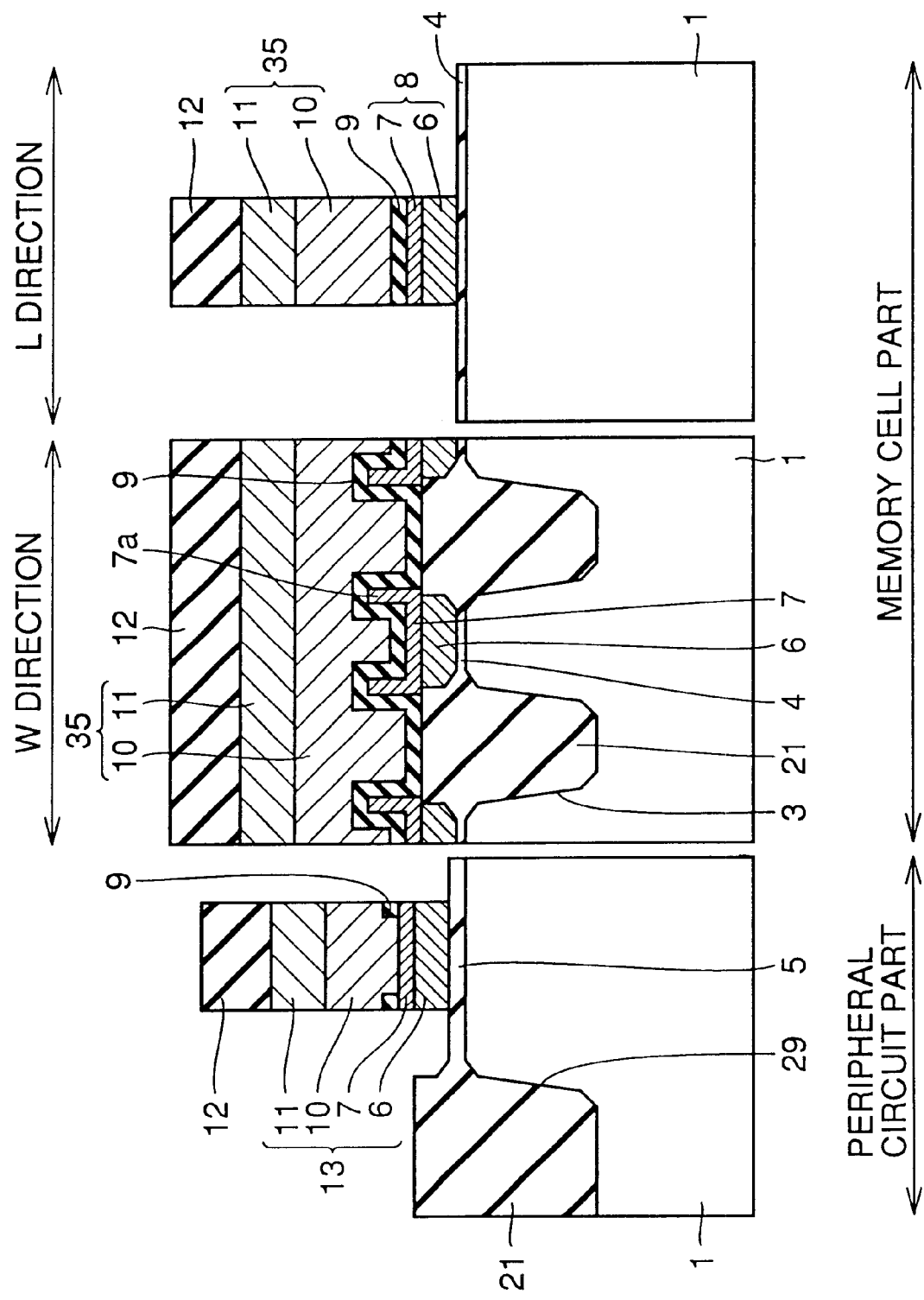
Figure 33:
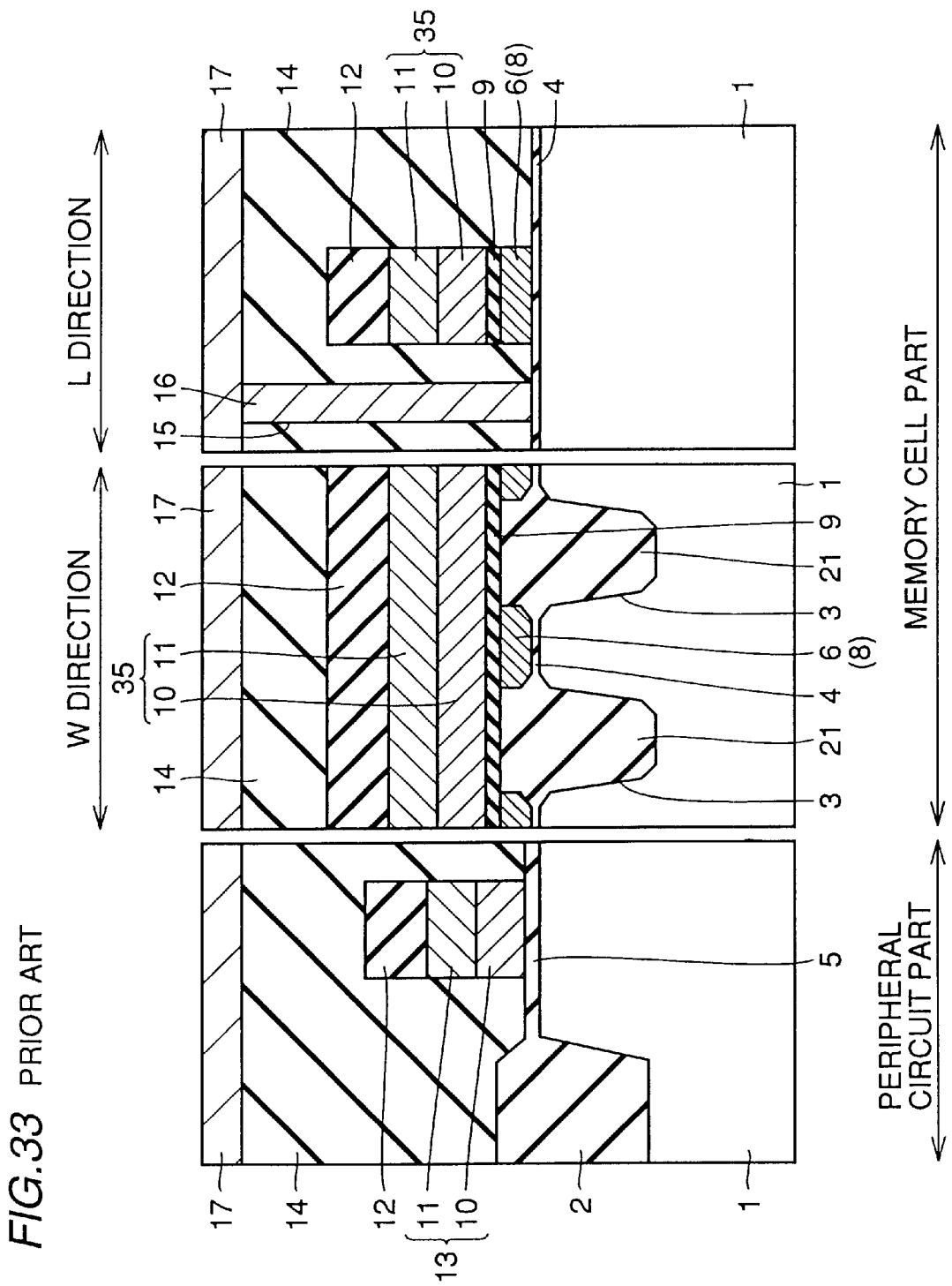
FIG. 33 is a cross section of a nonvolatile semiconductor memory device in the prior art.
Figure 34:
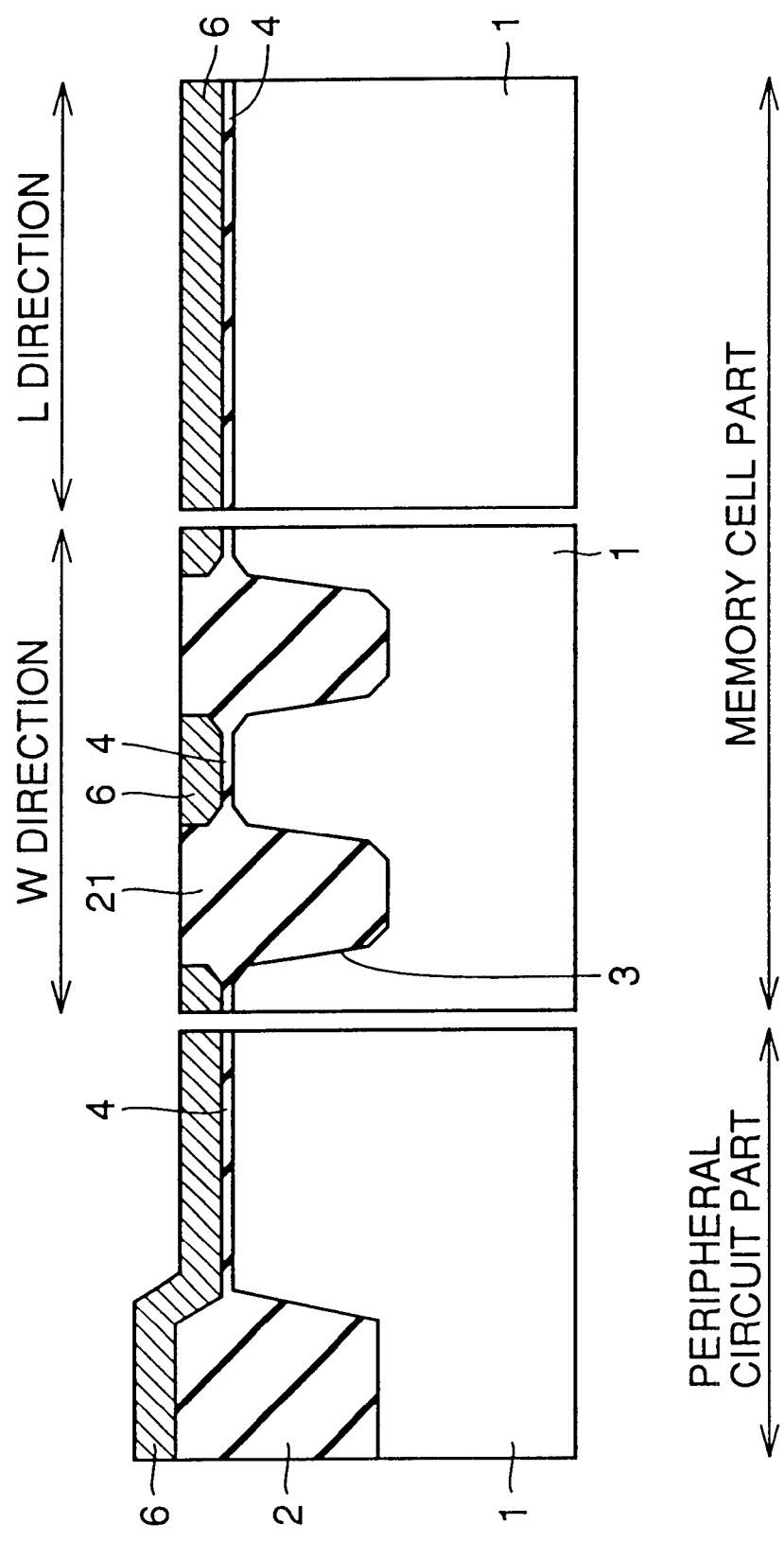
FIGS. 34–38 are cross sections showing 1st to 5th steps in a process of manufacturing the nonvolatile semiconductor memory device shown in FIG. 33, respectively.
Figure 35:
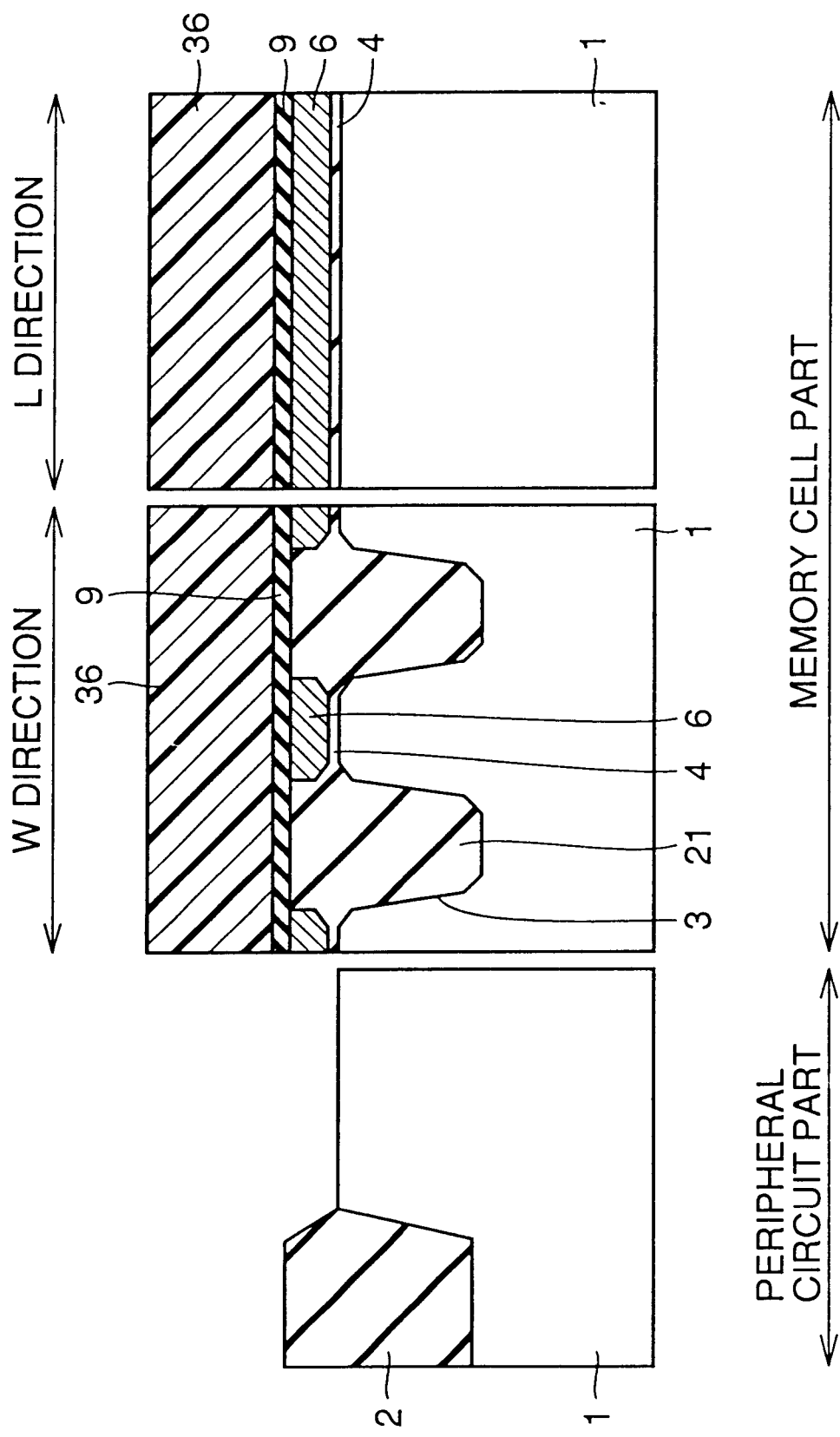
Figure 36:
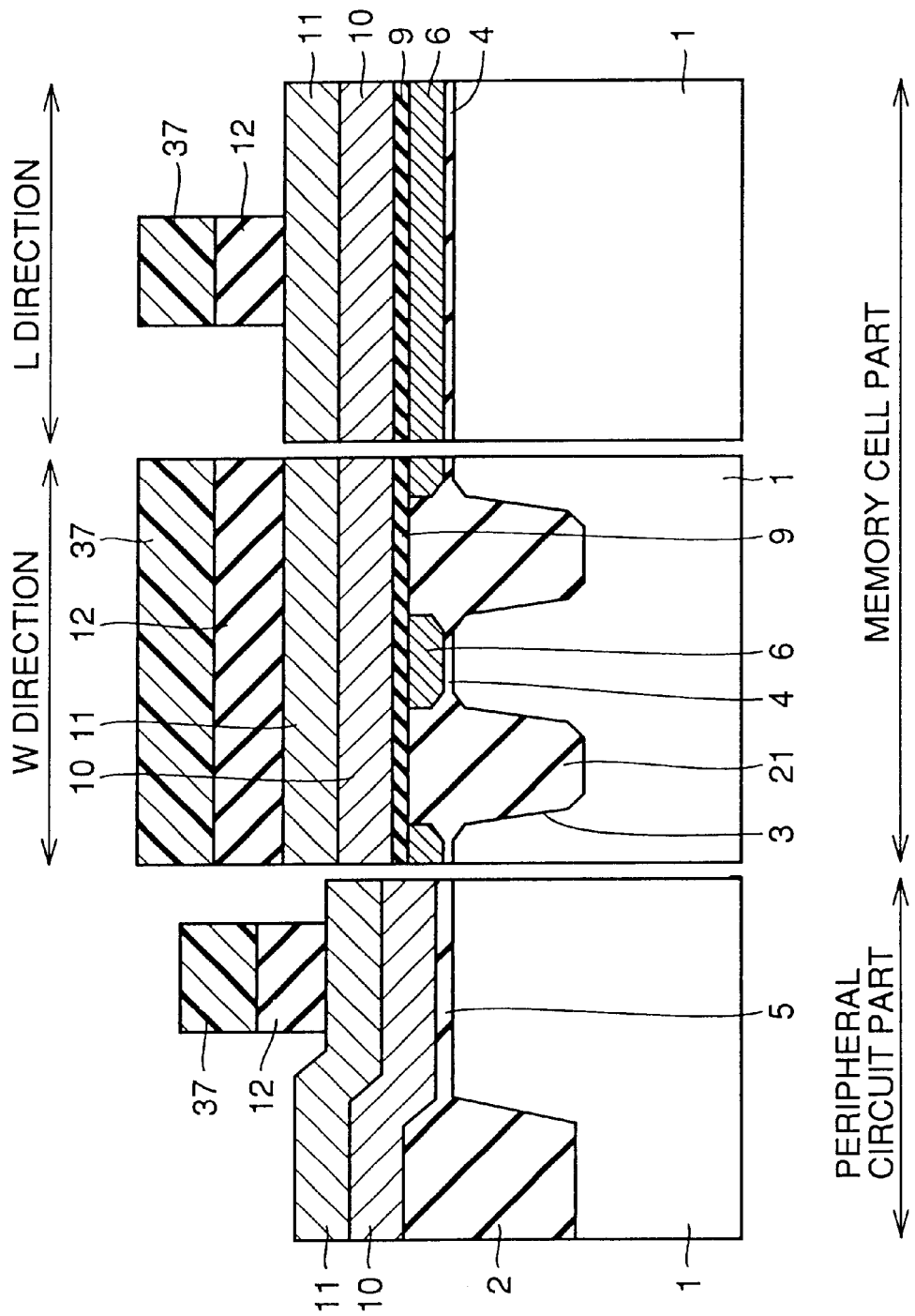
Figure 37:
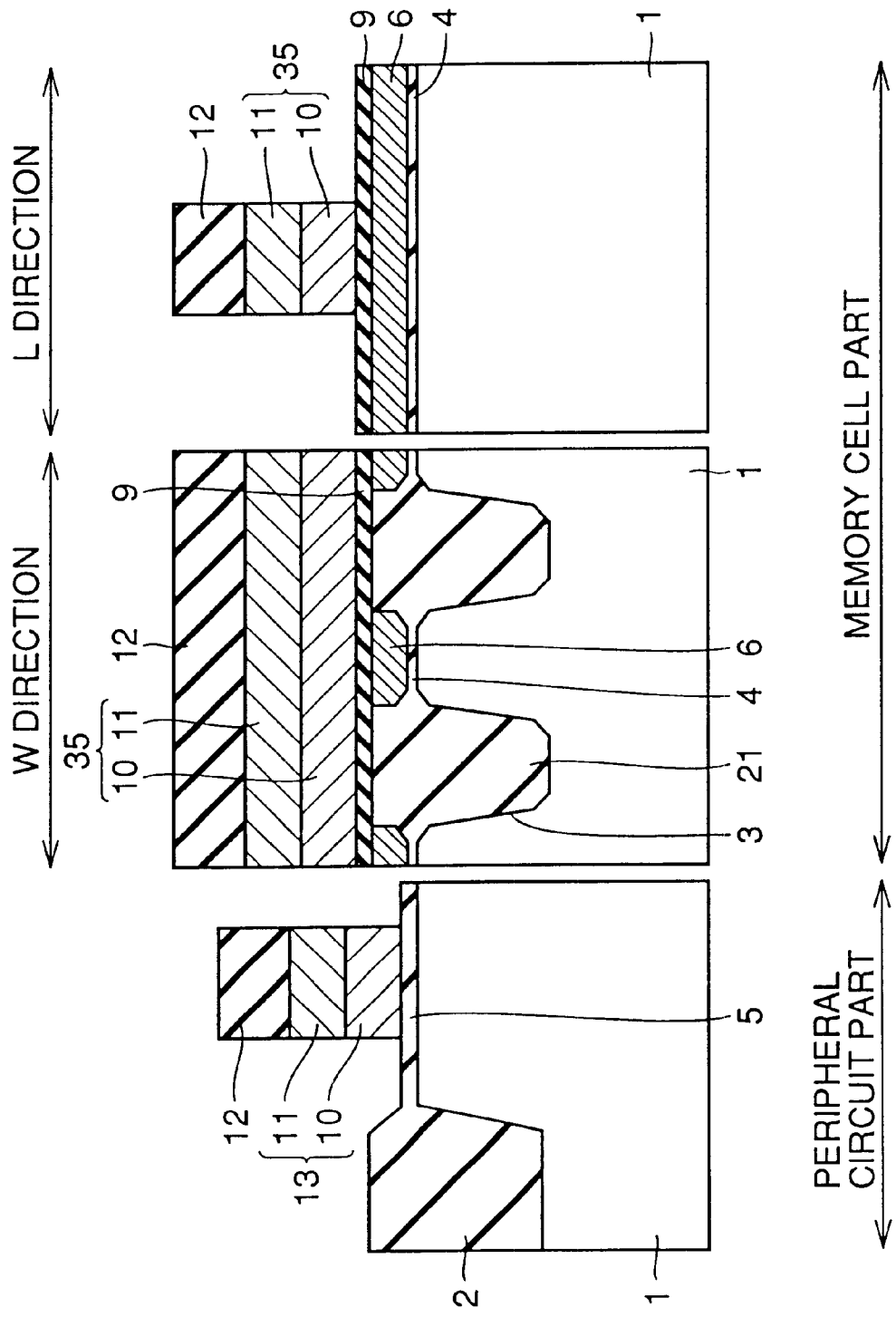
Figure 38:
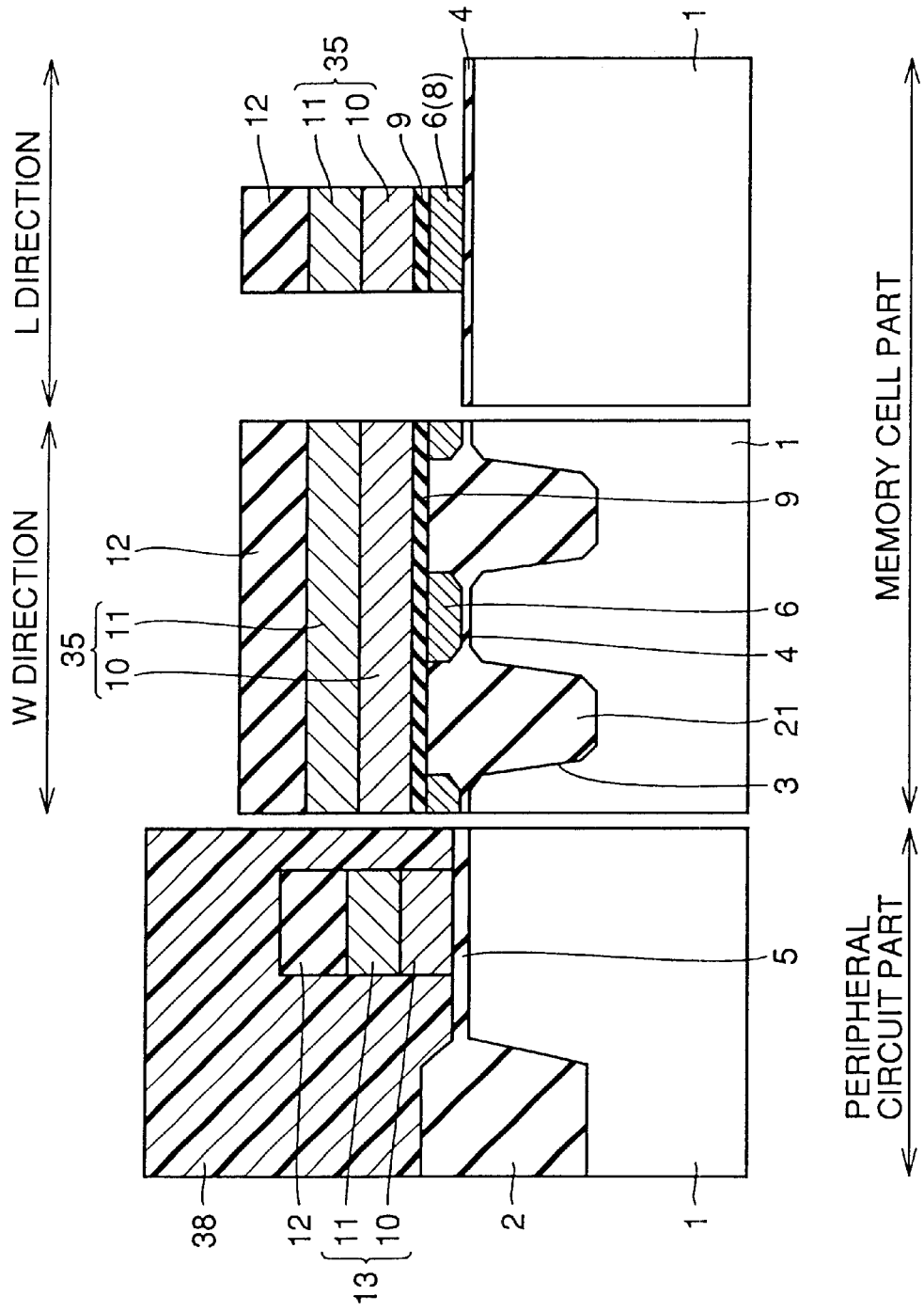

After removing photoresist 34, dry etching is effected on WSi film 11, doped polycrystalline silicon film 10, insulating film 9 and doped polycrystalline silicon films 6 and 7 masked with patterned silicon oxide film 12, as shown in FIGS. 31 and 32. Thereby, gate electrode 13, control gate electrode 35 and floating gate electrode 8 of each transistor in the peripheral circuit part are formed.

Thereafter, the nonvolatile semiconductor memory device shown in FIG. 16 is completed through steps similar to those of the first embodiment.

According to the invention, the capacitance between the floating gate electrode and the control gate electrode can be increased. Therefore, the coupling ratio between the floating gate electrode and the control gate electrode can be improved even in the nonvolatile semiconductor memory device having an increased density. Accordingly, the electric charges can be easily supplied into and discharged from the floating gate electrode, and the nonvolatile semiconductor memory device can have an improved performance.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:
   a semiconductor substrate having a main surface;
   a floating gate electrode having a first conductive film formed on said main surface with a tunnel insulating film therebetween, and a second conductive film laid over said first conductive film and having a convexity;
   an insulating film covering said second conductive film; and
   a control gate electrode formed on said insulating film, wherein the second conductive film covers the first conductive film.

2. The nonvolatile semiconductor memory device according to claim 1, wherein
   said convexity includes an upward wall extending upward from a peripheral portion of said second conductive film, and
   said insulating film and said control gate electrode cover the side surface of said upward wall.

3. The nonvolatile semiconductor memory device according to claim 1, further comprising:
   a trench for element isolation, wherein
   said trench is formed by etching said semiconductor substrate masked with said first conductive film.

4. A method of manufacturing a nonvolatile semiconductor memory device comprising the steps of:
   forming a mask film including a first conductive film on a main surface of a semiconductor substrate;
   etching said semiconductor substrate masked with said mask film to form a trench for element isolation;
   forming a first insulating film covering said trench and said mask film;
   reducing the thickness of said first insulating film to expose said mask film;
   reducing the thickness of said mask film to expose said first conductive film and form a convexity projecting upward beyond an upper surface of said first conductive film at said first insulating film;
   forming a second conductive film located on said convexity to form an upward wall at said second conductive film;
   removing said second conductive film located on said convexity to form an upward wall at said second conductive film, such that the second conductive film covers the first conductive film;
   forming successively a second insulating film and a third conductive film covering said upward wall; and
   patterning said third conductive film, said second insulating film, said second conductive film and said first conductive film to form a floating gate electrode and a control gate electrode.

5. The method of manufacturing the nonvolatile semiconductor memory device according to claim 4, wherein
   said mask film has a third insulating film on said first conductive film;
   said step of forming said mask film includes the steps of:
      forming said first conductive film on a main surface of said semiconductor substrate, and
      forming said third insulating film on said first conductive film; and
   said step of reducing the thickness of said mask film includes the step of:
      exposing said first conductive film by removing said third insulating film.

6. The method of manufacturing the nonvolatile semiconductor memory device according to claim 4, wherein
   said step of forming said upward wall includes the steps of:
      forming a coating film covering said second conductive film,
      reducing the thickness of said coating film to expose the surface of said second conductive film located on said convexity while leaving said coating film on said second conductive film located around said convexity, and
      removing the exposed second conductive film to form said upward wall.

7. The method of manufacturing the nonvolatile semiconductor memory device according to claim 6, wherein
   said coating film includes photoresist,
   said step of forming said coating film includes a step of applying photoresist covering said second conductive film, and
   said step of reducing the thickness of said coating film includes a step of performing development after effecting exposure on the whole surface of said photoresist, and thereby exposing the surface of said second conductive film on said convexity while leaving photoresist around said convexity.

8. The method of manufacturing the nonvolatile semiconductor memory device according to claim 4, wherein
   said nonvolatile semiconductor memory device includes a peripheral circuit part and a memory cell part,
   a fourth insulating film for element isolation is provided in said peripheral circuit part,
   said first insulating film is located within said memory cell part, and
   said fourth insulating film is formed before formation of said first insulating film.

9. The method of manufacturing the nonvolatile semiconductor memory device according to claim 4, wherein
   said nonvolatile semiconductor memory device includes a peripheral circuit part and a memory cell part,
   a fourth insulating film for element isolation is provided in said peripheral circuit part,
   said first insulating film is located within said memory cell part, and
   said fourth insulating film is formed in the same step as said first insulating film.

10. The nonvolatile semiconductor memory device according to claim 1, wherein:
    the first conductive film is formed with a first impurity concentration; and the second conductive film is formed with a second impurity concentration greater than the first impurity concentration.

11. The nonvolatile semiconductor memory device according to claim 1, wherein:

the first conductive film has a first thickness; and the second conductive film has a second thickness less than the first thickness.

12. The method of manufacturing the nonvolatile semiconductive memory device according to claim 4, comprising:

forming the first conductive film with a first impurity concentration; and forming the second conductive film with a second impurity concentration greater than the first impurity concentration.

13. The method of manufacturing the nonvolatile semiconductive memory device according to claim 4, comprising:

forming the first conductive film at a first thickness; and forming the second conductive film at a second thickness less than the first thickness.

* * * * *